United States Patent
Hayashida et al.

(10) Patent No.: US 8,025,023 B2
(45) Date of Patent: Sep. 27, 2011

(54) COATING AND DEVELOPING SYSTEM, COATING AND DEVELOPING METHOD AND STORAGE MEDIUM

(75) Inventors: Yasushi Hayashida, Koshi (JP); Yoshitaka Hara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 973 days.

(21) Appl. No.: 11/826,438

(22) Filed: Jul. 16, 2007

(65) Prior Publication Data

US 2008/0026153 A1 Jan. 31, 2008

(30) Foreign Application Priority Data

Jul. 31, 2006 (JP) .................................. 2006-208806

(51) Int. Cl.
*B05B 7/00* (2006.01)
(52) U.S. Cl. .......... 118/300; 118/52; 118/319; 118/320; 118/641; 396/611; 438/16
(58) Field of Classification Search .................... 118/52, 118/300, 641, 319–320; 438/16; 396/611
See application file for complete search history.

(56) References Cited

U.S. PATENT DOCUMENTS

| | | | |
|---|---|---|---|
| 6,454,472 B1 | 9/2002 | Kim et al. | |
| 2005/0105991 A1* | 5/2005 | Hofmeister et al. | 414/217 |
| 2005/0287821 A1* | 12/2005 | Higashi et al. | 438/780 |
| 2006/0120716 A1* | 6/2006 | Hamada | 396/611 |
| 2006/0156979 A1* | 7/2006 | Thakur et al. | 118/715 |

FOREIGN PATENT DOCUMENTS

| | | |
|---|---|---|
| JP | 3337677 | 8/2002 |
| JP | 2004-193597 | 7/2004 |
| JP | 2004-228594 A | 8/2004 |
| JP | 2005-11936 A | 1/2005 |

OTHER PUBLICATIONS

"Regarding duty to disclosure information to the USPTO" prepared and signed by the engineer.
Japanese Office Action issued on May 11, 2011 for Application No. 2006-208806 w/ English language translation.

* cited by examiner

Primary Examiner — Dah-Wei Yuan
Assistant Examiner — Albert Hilton
(74) Attorney, Agent, or Firm — Smith, Gambrell & Russell, LLP

(57) ABSTRACT

Wafers A1 to A10 of a first lot A and wafers B1 to B10 of a second lot B are processed by a second heating unit at different temperatures, respectively. A wafer W is carried in a processing block included in coating and developing system along a route passing a temperature control unit CPL2, a coating unit BCT, a heating unit LHP2, a temperature control unit CPL3, a coating unit COT, a heating unit LHP3, and a cooling unit COL in that order. The process temperature of the heating unit LHP3 is changed after the last wafer A10 of the first lot A has been processed by the heating unit LHP3. The wafers of the second lot B are carried according to a carrying schedule such that carrying cycles succeeding a carrying cycle in which the first substrate B1 of the second lot B is carried to the second temperature conditioning unit CPL3 carry the substrates B of the second lot B succeeding the first substrate B1 and processed by a heating process by the heating unit LHP2 in due order to a buffer unit BF2, and the wafers B held in the buffer unit BF2 are carried in due order to the downstream modules after the process temperature of the heating unit LHP3 has been changed.

12 Claims, 15 Drawing Sheets

| CARRYING CYCLES | CPL2 | BCT | LHP2 | BUFFER UNIT BF2 | | | | CPL3 | COT | LHP3 | COL3 | WEE |
|---|---|---|---|---|---|---|---|---|---|---|---|---|
| | | | | 41 | 42 | 43 | 44 | | | | | |
| 1 | A01 | | | | | | | | | | | |
| 2 | A02 | A01 | | | | | | | | | | |
| 3 | A03 | A02 | A01 | | | | | | | | | |
| 4 | A04 | A03 | A02 | A01 | | | | | | | | |
| 5 | A05 | A04 | A03 | A02 | | | | A01 | | | | |
| 6 | A06 | A05 | A04 | A03 | | | | A02 | A01 | | | |
| 7 | A07 | A06 | A05 | A04 | | | | A03 | A02 | A01 | | |
| 8 | A08 | A07 | A06 | A05 | | | | A04 | A03 | A02 | A01 | |
| 9 | A09 | A08 | A07 | A06 | | | | A05 | A04 | A03 | A02 | A01 |
| 10 | A10 | A09 | A08 | A07 | | | | A06 | A05 | A04 | A03 | A02 |
| 11 | B01 | A10 | A09 | A08 | | | | A07 | A06 | A05 | A04 | A03 |
| 12 | B02 | B01 | A10 | A09 | | | | A08 | A07 | A06 | A05 | A04 |
| 13 | B03 | B02 | B01 | A10 | | | | A09 | A08 | A07 | A06 | A05 |
| 14 | B04 | B03 | B02 | B01 | | | | A10 | A09 | A08 | A07 | A06 |
| 15 | B05 | B04 | B03 | B02 | | | | B01 | A10 | A09 | A08 | A07 |
| 16 | B06 | B05 | B04 | ↓ | B03 | | | ↓ | | A10 | A09 | A08 |
| 17 | ↓ | | B05 | ↓ | ↓ | B04 | | ↓ | | | A10 | A09 |
| 18 | ↓ | | | ↓ | ↓ | ↓ | B05 | ↓ | | | | A10 |
| 19 | ↓ | | | ↓ | ↓ | ↓ | ↓ | ↓ | | | | |
| 20 | ↓ | | | | ↓ | ↓ | ↓ | ↓ | | PROCESS TEMPERATURE CHANGING PROCESS | | | |
| 21 | ↓ | | | | ↓ | ↓ | ↓ | ↓ | | | | |
| 22 | ↓ | | | | ↓ | ↓ | ↓ | ↓ | | | | |
| 23 | ↓ | | | | ↓ | ↓ | ↓ | ↓ | | | | |
| 24 | ↓ | | | | ↓ | ↓ | ↓ | ↓ | | | | |
| 25 | ↓ | | | | ↓ | ↓ | ↓ | ↓ | | | | |
| 26 | ↓ | | | | ↓ | ↓ | ↓ | ↓ | | | | |
| 27 | ↓ | | | | ↓ | ↓ | ↓ | ↓ | | | | |
| 28 | ↓ | | | | ↓ | ↓ | ↓ | ↓ | | | | |
| 29 | | | | | ↓ | ↓ | ↓ | ↓ | B02 | B01 | | | |
| 30 | B07 | B06 | | | | ↓ | ↓ | ↓ | B03 | B02 | B01 | | |
| 31 | B08 | B07 | B06 | | | | ↓ | ↓ | B04 | B03 | B02 | B01 | |
| 32 | B09 | B08 | B07 | B06 | | | | | B05 | B04 | B03 | B02 | B01 |
| 33 | B10 | B09 | B08 | B07 | | | | | B06 | B05 | B04 | B03 | B02 |
| 34 | | B10 | B09 | B08 | | | | | B07 | B06 | B05 | B04 | B03 |
| 35 | | | B10 | B09 | | | | | B08 | B07 | B06 | B05 | B04 |
| 36 | | | | B10 | | | | | B09 | B08 | B07 | B06 | B05 |
| 37 | | | | | | | | | B10 | B09 | B08 | B07 | B06 |
| 38 | | | | | | | | | | B10 | B09 | B08 | B07 |
| 39 | | | | | | | | | | | B10 | B09 | B08 |
| 40 | | | | | | | | | | | | B10 | B09 |
| 41 | | | | | | | | | | | | | B10 |

FIG. 10

| CARRYING CYCLES | CPL2 | BCT | LHP2 | CPL3 | COT | LHP3 | COL3 | WEE |
|---|---|---|---|---|---|---|---|---|
| 1 | A01 | | | | | | | |
| 2 | A02 | A01 | | | | | | |
| 3 | A03 | A02 | A01 | | | | | |
| 4 | A04 | A03 | A02 | A01 | | | | |
| 5 | A05 | A04 | A03 | A02 | A01 | | | |
| 6 | A06 | A05 | A04 | A03 | A02 | A01 | | |
| 7 | A07 | A06 | A05 | A04 | A03 | A02 | A01 | |
| 8 | A08 | A07 | A06 | A05 | A04 | A03 | A02 | A01 |
| 9 | A09 | A08 | A07 | A06 | A05 | A04 | A03 | A02 |
| 10 | A10 | A09 | A08 | A07 | A06 | A05 | A04 | A03 |
| 11 | | A10 | A09 | A08 | A07 | A06 | A05 | A04 |
| 12 | | | A10 | A09 | A08 | A07 | A06 | A05 |
| 13 | | | | A10 | A09 | A08 | A07 | A06 |
| 14 | | | | | A10 | A09 | A08 | A07 |
| 15 | | | | | | A10 | A09 | A08 |
| 16 | | | | | | | A10 | A09 |
| 17 | | | | | | | | A10 |
| 18 | | | | | | | | |
| 19 | | | | | | | | |
| 20 | | | | | | PROCESS TEMPERATURE CHANGING PROCESS | | |
| 21 | | | | | | | | |
| 22 | | | | | | | | |
| 23 | | | | | | | | |
| 24 | | | | | | | | |
| 25 | | | | | | | | |
| 26 | | | | | | | | |
| 27 | | | | | | | | |
| 28 | B01 | | | | | | | |
| 29 | B02 | B01 | | | | | | |
| 30 | B03 | B02 | B01 | | | | | |
| 31 | B04 | B03 | B02 | B01 | | | | |
| 32 | B05 | B04 | B03 | B02 | B01 | | | |
| 33 | B06 | B05 | B04 | B03 | B02 | B01 | | |
| 34 | B07 | B06 | B05 | B04 | B03 | B02 | B01 | |
| 35 | B08 | B07 | B06 | B05 | B04 | B03 | B02 | B01 |
| 36 | B09 | B08 | B07 | B06 | B05 | B04 | B03 | B02 |
| 37 | B10 | B09 | B08 | B07 | B06 | B05 | B04 | B03 |
| 38 | | B10 | B09 | B08 | B07 | B06 | B05 | B04 |
| 39 | | | B10 | B09 | B08 | B07 | B06 | B05 |
| 40 | | | | B10 | B09 | B08 | B07 | B06 |
| 41 | | | | | B10 | B09 | B08 | B07 |
| 42 | | | | | | B10 | B09 | B08 |
| 43 | | | | | | | B10 | B09 |
| 44 | | | | | | | | B10 |

FIG. 11

| CARRYING CYCLES | CPL2 | BCT | LHP2 | 41 | 42 | 43 | 44 | CPL3 | COT | LHP3 | COL3 | WEE |
|---|---|---|---|---|---|---|---|---|---|---|---|---|
| 1 | A01 | | | | | | | | | | | |
| 2 | A02 | A01 | | | | | | | | | | |
| 3 | A03 | A02 | A01 | | | | | | | | | |
| 4 | A04 | A03 | A02 | A01 | | | | | | | | |
| 5 | A05 | A04 | A03 | A02 | | | | A01 | | | | |
| 6 | A06 | A05 | A04 | A03 | | | | A02 | A01 | | | |
| 7 | A07 | A06 | A05 | A04 | | | | A03 | A02 | A01 | | |
| 8 | A08 | A07 | A06 | A05 | | | | A04 | A03 | A02 | A01 | |
| 9 | A09 | A08 | A07 | A06 | | | | A05 | A04 | A03 | A02 | A01 |
| 10 | A10 | A09 | A08 | A07 | | | | A06 | A05 | A04 | A03 | A02 |
| 11 | B01 | A10 | A09 | A08 | | | | A07 | A06 | A05 | A04 | A03 |
| 12 | B02 | B01 | A10 | A09 | | | | A08 | A07 | A06 | A05 | A04 |
| 13 | B03 | B02 | B01 | A10 | | | | A09 | A08 | A07 | A06 | A05 |
| 14 | B04 | B03 | B02 | B01 | | | | A10 | A09 | A08 | A07 | A06 |
| 15 | B05 | B04 | B03 | B02 | | | | B01 | A10 | A09 | A08 | A07 |
| 16 | B06 | B05 | B04 | ↓ | B03 | | | ↓ | | A10 | A09 | A08 |
| 17 | ↓ | | B05 | ↓ | ↓ | B04 | | ↓ | | | A10 | A09 |
| 18 | ↓ | | | ↓ | ↓ | ↓ | B05 | ↓ | CLEANING PROCESS | | | A10 |
| 19 | ↓ | | | ↓ | ↓ | ↓ | ↓ | ↓ | | | | |
| 20 | ↓ | | | | ↓ | ↓ | ↓ | ↓ | | | | |
| 21 | ↓ | | | | | ↓ | ↓ | ↓ | | | | |
| 22 | ↓ | | | | | | ↓ | ↓ | | | | |
| 23 | ↓ | | | | | ↓ | ↓ | B02 | B01 | | | |
| 24 | B07 | B06 | | | | | ↓ | B03 | B02 | B01 | | |
| 25 | B08 | B07 | B06 | | | | | ↓ | B04 | B03 | B02 | B01 |
| 26 | B09 | B08 | B07 | B06 | | | | B05 | B04 | B03 | B02 | B01 |
| 27 | B10 | B09 | B08 | B07 | | | | B06 | B05 | B04 | B03 | B02 |
| 28 | | B10 | B09 | B08 | | | | B07 | B06 | B05 | B04 | B03 |
| 29 | | | B10 | B09 | | | | B08 | B07 | B06 | B05 | B04 |
| 30 | | | | B10 | | | | B09 | B08 | B07 | B06 | B05 |
| 31 | | | | | | | | B10 | B09 | B08 | B07 | B06 |
| 32 | | | | | | | | | B10 | B09 | B08 | B07 |
| 33 | | | | | | | | | | B10 | B09 | B08 |
| 34 | | | | | | | | | | | B10 | B09 |
| 35 | | | | | | | | | | | | B10 |

FIG. 13

| CARRYING CYCLES | CPL2 | BCT | LHP2 | CPL3 | COT | LHP3 | COL3 | WEE |
|---|---|---|---|---|---|---|---|---|
| 1 | A01 | | | | | | | |
| 2 | A02 | A01 | | | | | | |
| 3 | A03 | A02 | A01 | | | | | |
| 4 | A04 | A03 | A02 | A01 | | | | |
| 5 | A05 | A04 | A03 | A02 | A01 | | | |
| 6 | A06 | A05 | A04 | A03 | A02 | A01 | | |
| 7 | A07 | A06 | A05 | A04 | A03 | A02 | A01 | |
| 8 | A08 | A07 | A06 | A05 | A04 | A03 | A02 | A01 |
| 9 | A09 | A08 | A07 | A06 | A05 | A04 | A03 | A02 |
| 10 | A10 | A09 | A08 | A07 | A06 | A05 | A04 | A03 |
| 11 | | A10 | A09 | A08 | A07 | A06 | A05 | A04 |
| 12 | | | A10 | A09 | A08 | A07 | A06 | A05 |
| 13 | | | | A10 | A09 | A08 | A07 | A06 |
| 14 | | | | | A10 | A09 | A08 | A07 |
| 15 | | | | | | A10 | A09 | A08 |
| 16 | | | | | | | A10 | A09 |
| 17 | | | | | CLEANING PROCESS | | | A10 |
| 18 | | | | | | | | |
| 19 | | | | | | | | |
| 20 | | | | | | | | |
| 21 | | | | | | | | |
| 22 | B01 | | | | | | | |
| 23 | B02 | B01 | | | | | | |
| 24 | B03 | B02 | B01 | | | | | |
| 25 | B04 | B03 | B02 | B01 | | | | |
| 26 | B05 | B04 | B03 | B02 | B01 | | | |
| 27 | B06 | B05 | B04 | B03 | B02 | B01 | | |
| 28 | B07 | B06 | B05 | B04 | B03 | B02 | B01 | |
| 29 | B08 | B07 | B06 | B05 | B04 | B03 | B02 | B01 |
| 30 | B09 | B08 | B07 | B06 | B05 | B04 | B03 | B02 |
| 31 | B10 | B09 | B08 | B07 | B06 | B05 | B04 | B03 |
| 32 | | B10 | B09 | B08 | B07 | B06 | B05 | B04 |
| 33 | | | B10 | B09 | B08 | B07 | B06 | B05 |
| 34 | | | | B10 | B09 | B08 | B07 | B06 |
| 35 | | | | | B10 | B09 | B08 | B07 |
| 36 | | | | | | B10 | B09 | B08 |
| 37 | | | | | | | B10 | B09 |
| 38 | | | | | | | | B10 |

F I G . 1 4

COATING AND DEVELOPING SYSTEM, COATING AND DEVELOPING METHOD AND STORAGE MEDIUM

BACKGROUND OF THE INVENTION

1. Field of the Invention

The present invention relates to a coating and developing system for coating a substrate, such as a semiconductor wafer or an LCD substrate, namely, a glass substrate for a liquid crystal display, with a resist solution by a coating process and processing the substrate by a developing process after exposure, a coating and developing method to be carried out by the coating and developing system, and a storage medium storing a program for carrying out the coating and developing method.

2. Description of the Related Art

A manufacturing process for manufacturing a semiconductor device or an LCD substrate forms a resist patter on a substrate by photolithography. Photolithography includes a series of steps of coating a surface of a substrate, such as a semiconductor wafer (hereinafter, referred to as "wafer") with a resist film by applying a resist solution to the surface, exposing the resist film to light through a photomask, and processing the exposed resist film by a developing process to form a desired pattern.

Generally, those processes are carried out by a resist pattern forming system constructed by connecting an exposure system to a coating and developing system for coating a surface of a substrate with a resist solution and developing an exposed film. Such a resist pattern forming system is proposed in, for example, JP-A 2004-193597. Referring to FIG. 15 showing this known resist pattern forming system, a carrier 10 containing a plurality of wafers W is delivered to a carrier stage 11 included in a carrier block 1A, and a transfer arm 12 transfers the wafer W contained in the carrier 10 to a processing block 1B. Then, the wafer W is carried in the processing block 1B along a route passing a first temperature control unit, an antireflection film forming unit, and a first heating unit in that order to form an antireflection film on a surface of the wafer W.

Subsequently, the wafer W is carried along a route passing a second temperature control unit, a coating unit, a second heating unit and a cooling unit in that order to form a resist film on the surface of the antireflection film. Then, the wafer W is carried through an interface block 1 to a developing system 1D. The wafer W is returned to the processing block 1B after being processed by an exposure process. Then, the wafer W is processed by a developing process in a developing unit 13B, and then the wafer W is returned to the carrier 10. The antireflection film forming unit, not shown, is disposed under the coating unit 13A or the developing unit 13B.

The first and the second heating unit, the first and the second temperature control unit, the cooling unit and transfer stages are stacked in layers in shelf units 14 (shelf units 14a to 14c). Two carrying devices 15A and 15B installed in the processing block 1B carry the wafer W in the processing block 1B from one to other of modules that receive the wafer W, such as the antireflection film forming unit, the coating unit 13A, the developing unit 13, and component units of the shelf units 14a to 14c to subject the wafer W. The wafer W is subjected to the foregoing processes. As mentioned in JP-A 2004-193597, wafers W to be subjected to the foregoing processes are carried to the modules according to a carrying schedule defining times when the wafers W are carried to the modules, respectively.

In some cases, wafers A of a preceding lot A and wafers B of a succeeding lot B are delivered successively from the carrier block 1A to the processing block 1B to process the wafers A and the wafers B, and the wafers A and the wafers B are processed by a heating process by the second heating unit at different temperatures, respectively. In the heating process, a wafer is mounted on, for example, a heating plate heated at a predetermined temperature. The heating temperature of the heating process is changed by changing a set temperature at which the heating plate is to be heated.

When the process temperature of the second heating unit needs to be changed, the wafers A and B are carried according to a carrying schedule including the steps of withholding the delivery of the first wafer B1 of the lot B from the carrier block 1A to the processing block 1B after the last wafer A10 of the lot A has been delivered from the carrier block 1A to the processing block 1B, starting changing the process temperature of the second heating unit after the last wafer A10 processed by the second heating unit has been transferred to the next unit, and starting the first wafer B1 from the carrier block 1A to the processing block 1B after the completion of changing the process temperature of the second heating unit.

Since the transfer of the wafers B of the lot B to the processing block 1B is withheld until the completion of changing the process temperature of the second heating unit, the processing block 1B can not process the wafers B during the operation for changing the process temperature of the second heating unit. If changing the process temperature of the second heating unit takes a long time, the wafers B held for a long time without being processed and, consequently, the throughput of the resist pattern forming system reduces.

The through put of the exposure system has increased in recent years and the processing capacity of the coating and developing system is required to be compatible with the increased throughput of the developing system. The inventors of the present invention have made efforts to reduce load on the carrying devices, to improve carrying efficiency and to increase the throughput of the coating and developing system by stacking up an area in which the modules for processing the wafer before the wafer is subjected to an exposure process are arranged, and an area in which the modules for processing the wafer processed by the exposure process are arranged, and installing carrying devices in those areas, respectively. A system having a coating area for a coating process and a developing area for developing process stacked one on top of the other, and carrying devices respectively installed in the coating area and the developing area is mentioned in Jpn. Pat. No. 3337677.

SUMMARY OF THE INVENTION

The present invention has been made under such circumstances and it is therefore an object of the present invention to improve throughput when process temperature for a second heating unit is changed after the completion of processing a plurality of substrates of the same type of a first lot and before the start of processing a plurality of substrates of the same type of a second lot.

A coating and developing system according to the present invention includes: a carrier block, for holding carriers each containing a plurality of substrates, provided with a transfer means for carrying the substrate from and to each of the carriers; and a processing block for forming a film on the substrate transferred thereto by the transfer means and processing the substrate processed by an exposure process by a developing process;

the processing block being provided with a substrate carrying means for carrying the substrate along a route passing a first temperature conditioning unit for adjusting temperature of the substrate to a first temperature, a first coating unit for applying a first coating solution to the substrate, a first heating unit for processing the substrate by a heating process, a second temperature conditioning unit for adjusting the temperature of the substrate to a second temperature, a second heating unit for processing the substrate by a heating process, and a cooling unit for cooling the substrate in that order, the substrates being carried successively to modules for holding the substrate according to a carrying schedule by repeating a carrying cycle in which the substrate carrying means carries the substrate to the modules in order of increasing number of the modules such that the substrates of lower numbers are in the modules of higher numbers than the substrates of higher numbers;

the improvement comprising:

a buffer unit placed in the processing block and capable of holding a plurality of substrates;

a temperature changing means for changing process temperature of the second heating unit from a temperature for processing a plurality of substrates of the same type of a first lot to a temperature for processing a plurality of substrates of the same type of a second lot after the completion of processing the substrates of the first lot by a heating process by the second heating unit; and a control means for controlling the substrate carrying means such that carrying cycles succeeding a carrying cycle in which the first substrate of the second lot is carried to the second temperature conditioning unit carry the substrates succeeding the first substrate and processed by a heating process by the first heating unit in due order to the buffer unit, and the substrates held in the buffer unit are carried in due order to the downstream modules after the process temperature of the second heating unit has been changed from the temperature for processing the substrates of the first lot to the temperature for processing the substrates of the second lot.

When the processing unit is provided with a plurality of second temperature conditioning units, the substrates processed by a heating process by the first heating unit are those succeeding the substrates distributed to the second temperature conditioning units.

The processing block may include: a first coating film forming unit block including the first temperature conditioning unit, the first coating unit, the first heating unit, the buffer unit and the substrate carrying means for carrying the substrate to those units;

a second coating film forming unit block including the second temperature conditioning unit, the second coating unit, the second heating unit and the substrate carrying means for carrying the substrate to those units, and disposed on or beneath the first coating film forming unit block;

a developing unit block including the developing unit for processing the substrate by a developing process, the heating unit for processing the substrate by a heating process, a cooling unit for cooling the substrate, and substrate carrying means for carrying the substrate to those units, and disposed on or beneath the first and the second coating film forming unit block;

transfer parts respectively included in the first coating film forming unit block, the second coating film forming unit block and the developing unit block to transfer the substrate between the unit blocks; and transfer means for transferring the substrate among the transfer parts of the unit blocks.

The substrate may be carried to and carried out from the buffer unit by means of the substrate carrying means of the first coating film forming unit block and the transfer means of the processing block. The coating and developing system may include a control means for controlling the substrate carrying means so as to prevent carrying out the substrate from the first temperature conditioning unit when the two or more substrates of the second lot are held in the buffer unit or may include a control means for controlling the substrate carrying means so as to start carrying out the substrate from the first temperature conditioning unit after the start of carrying the substrates of the second lot held in the buffer unit to the modules on the downstream side of the buffer unit.

The first coating unit may apply a coating solution for forming an antireflection film to the substrate before a resist solution is applied to the substrate, and the second coating unit may apply a resist solution to the substrate. The first coating unit may apply a resist solution to the substrate, and the second coating unit may apply a coating solution for forming an antireflection film to the substrate after the substrate has been coated with the resist solution.

A coating and developing method according to the present invention for forming a film on a substrate transferred from a carrier block for holding carriers each containing a plurality of substrates to a processing block by the processing block and processing a substrate processed by an exposure process by a developing process;

the processing block being provided with substrate carrying means for carrying the substrate along a route passing a first temperature conditioning unit for adjusting the temperature of the substrate to a first temperature, a first coating unit for applying a first coating solution to the substrate, a first heating unit for processing the substrate by a heating process, a second temperature conditioning unit for adjusting the temperature of the substrate to a second temperature, a second heating unit for processing the substrate by a heating process, and a cooling unit for cooling the substrate in that order, and the substrates being carried in due order to modules for holding the substrate according to a carrying schedule by repeating a carrying cycle in which the substrate carrying means carries the substrate to the modules in order of increasing number of the modules such that the substrate of lower numbers are in the modules of higher numbers than the substrates of higher numbers;

the coating and developing method including the steps of:

processing substrates of the same type of a first lot taken out from the carrier by a coating film forming process by carrying the substrates according to a predetermined carrying schedule;

changing process temperature of the second heating unit from a temperature for processing the plurality of substrates of the same type of the first lot to a temperature for processing a plurality of substrates of the same type of a second lot after the completion of processing the substrates of the first lot by a heating process by the second heating unit;

rewriting the carrying schedule such that carrying cycles succeeding a carrying cycle in which the first substrate of the second lot is carried to the second temperature conditioning unit carry the substrates succeeding the first substrate and processed by a heating process by the first heating unit sequentially to a buffer unit capable of holding a plurality of substrates, and the substrates held in the buffer unit are carried successively to the downstream modules after process temperature of the second heating unit has been changed from a temperature for processing the substrates of the first lot to a temperature for processing the substrates of the second lot; and processing the substrates of the second lot by a film forming process by carrying the sub substrates according to a rewritten carrying schedule.

A storage medium according to the present invention storing a computer program, for controlling a coating and developing system including a carrier block for holding a carrier containing a plurality of substrates, and a processing block for processing a substrate received from the carrier block to form a coating film on the substrate and to process the substrate processed by an exposure process by a developing process; wherein the program specifies the steps of a coating and developing method according to the present invention.

According to the present invention, the process temperature of the second heating unit to which the substrate is carried after being processed by the second coating unit can be changed from a temperature for processing the substrates of the first lot provided by a carrier to a temperature for processing the substrate of the second lot provided by another carrier so that the throughput may be improved.

BRIEF DESCRIPTION OF THE DRAWINGS

FIG. 10 is diagram showing a carrying schedule by way of example;

FIG. 11 is a diagram showing a conventional carrying schedule by way of example;

FIG. 13 is a diagram showing a carrying schedule by way of example;

FIG. 14 is a diagram of an example of a conventional carrying schedule; and

DESCRIPTION OF THE PREFERRED EMBODIMENTS

Figure 1:
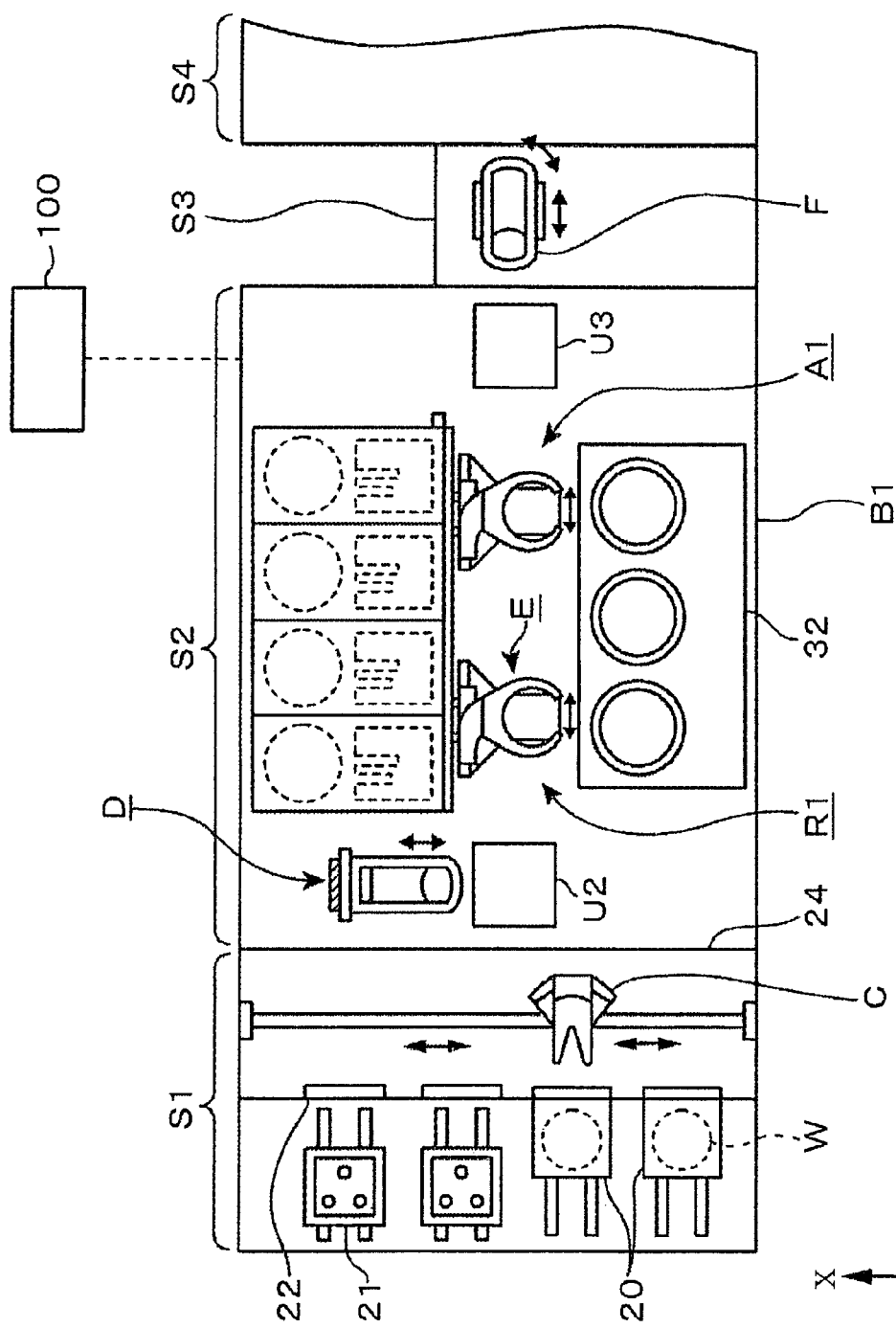
FIG. 1 is a plan view of a coating and developing system in a preferred embodiment according to the present invention.
Figure 2:
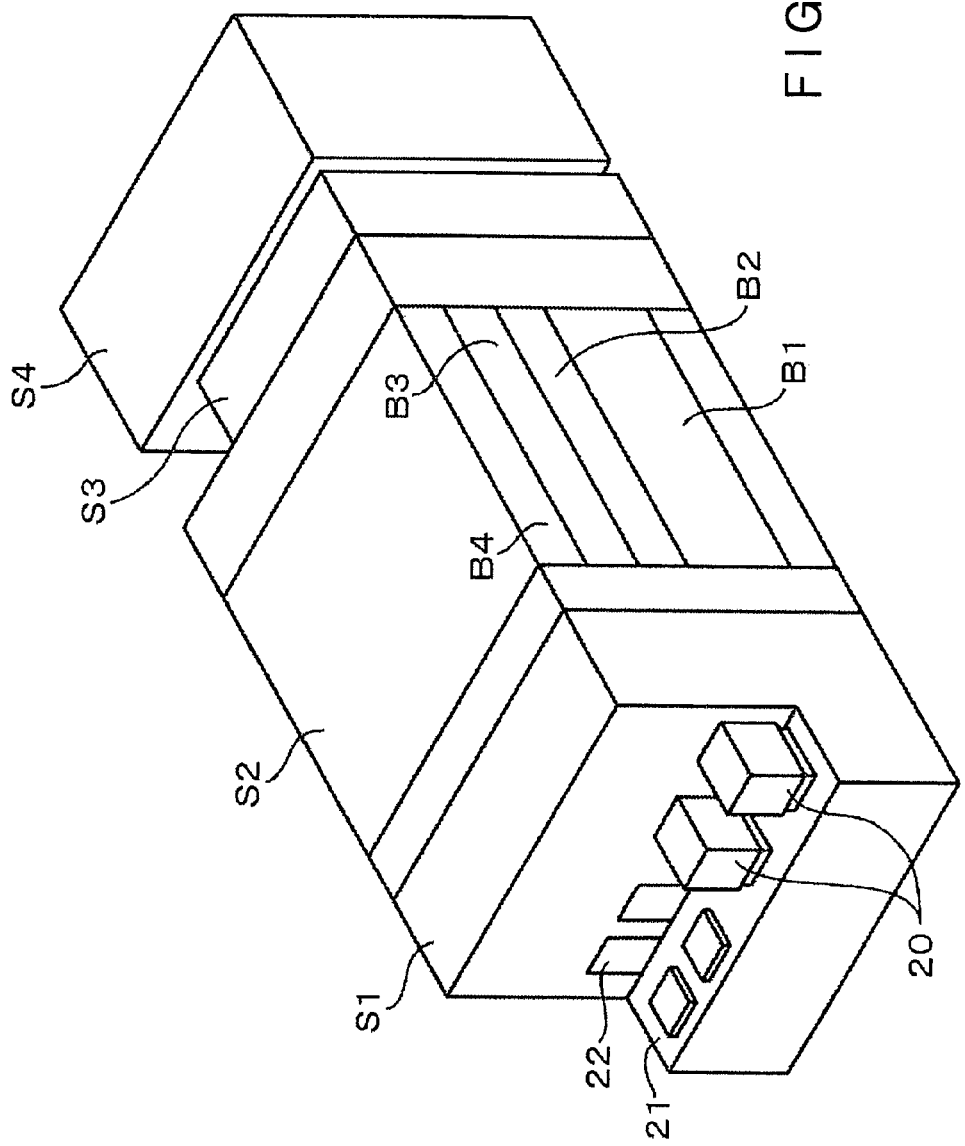
FIG. 2 is a perspective view of the coating and developing system shown in FIG. 1.
Figure 3:
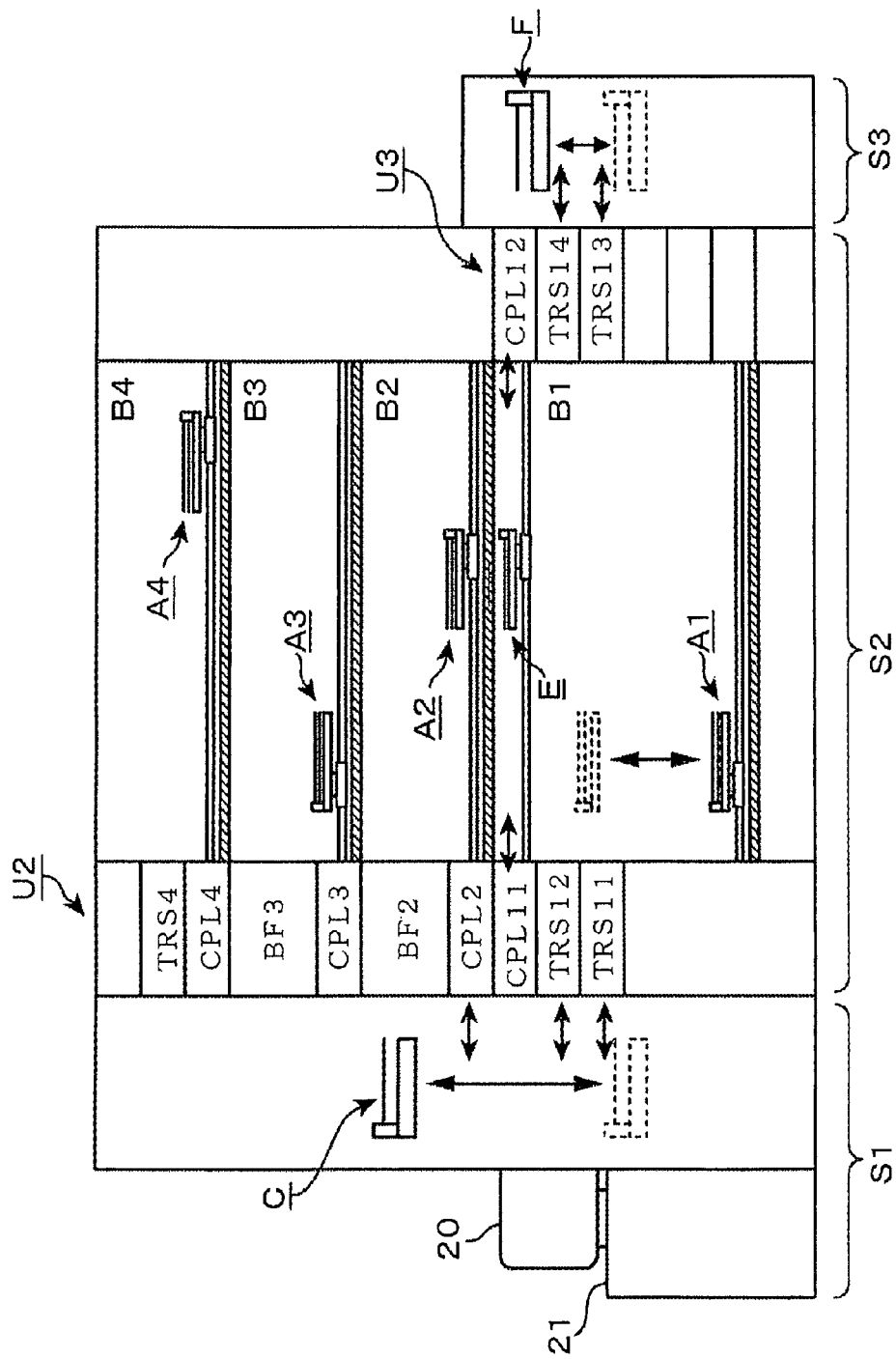
FIG. 3 is a sectional side elevation of the coating and developing system shown in FIG. 1.

A resist pattern forming system as an embodiment of a coating and developing system according to the present invention will be described with reference to the accompanying drawings. FIGS. 1, 2 and 3 are a plan view, a schematic perspective view and a schematic side elevation, respectively, of the resist pattern forming system. The resist pattern forming system has carrier block S1 for receiving and sending out carriers 20 each containing, for example, thirteen wafers W in an airtight fashion, a processing block S2 formed by stacking up a plurality of unit blocks, for example, four unit blocks B1 to B4, an interface block S3 and an exposure system 54.

The carrier block S1 is provided with carrier tables 21 on which carriers 20 are supported, a wall disposed behind the carrier tables 21 and provided with closable openings 22, and a transfer arm C, namely, transfer means, for taking out the wafers W from the carrier 20 through the closable opening 22. The transfer arm C is movable in vertical directions, longitudinal directions, and transverse directions, namely, directions in which the carriers 20 are arranged, and turnable abut a vertical axis. The transfer arm C carries wafers W from and to temperature conditioning unit CPL2 included in the unit block B2, transfer stages TRS11 and TRS12 included in the unit block B1.

The processing block S2 surrounded by a box 24 is disposed behind and joined to the carrier block S1. In the processing block S2, the first unit block B1, namely, a DEV layer, a second unit block B2, namely, a BCT layer, for forming an antireflection film, namely, a first antireflection film, under a resist film, a third unit block B3, namely, a COT layer, for forming a resist film, and a fourth unit block B4, namely, a TCT layer, for forming an antireflection film, namely, a second antireflection film, on the resist film. The first unit block B1, the second unit block B2, the third unit block B3 and the fourth unit block B4 are stacked up in that order and are isolated from each other. The unit blocks B2 to B4 corresponds to a coating film forming unit block.

The unit blocks B1 to B4 are similar in construction. The unit blocks B1 to B4 are provided with wet processing units for coating a wafer W with a coating solution, processing units, such as heating units and temperature conditioning units, for processing a wafer W by pretreatment processes before the wafer W is processed by the wet processing unit, and by posttreatment processes after the wafer W has been processed by the wet process, main arms A1 to A4, namely, carrying means, for carrying a wafer W to transfer a wafer W between the wet processing units and the processing units. The respective wet processing units, the heating units, the temperature conditioning units and the main arms A1 to A4 of the unit blocks B1 to B4 are disposed in the unit blocks B1 to B4 in the same layout. Disposition of the processing units and the main arms A1 to A4 in the same layout signifies that the respective processing centers of wafers W placed in the corresponding processing units and on the main arms A1 to A4 are aligned.

As shown in FIGS. 1 to 3, a shelf unit U2 is disposed in regions in the unit blocks B1 to B4 adjacent to the carrier block S1. The transfer arm C and the main arms A1 to A4 can access the shelf unit U2. The shelf unit U2 has a first transfer unit for each of the unit blocks. A wafer W can be transferred between the unit blocks through the first transfer unit. A transfer arm D, namely, transfer means, carries a wafer W to and from the transfer units of the shelf unit U2. The transfer arm D can move in vertical directions and longitudinal directions. As shown in FIGS. 1 and 3, a shelf unit U3 is disposed in a region in the DEV layer B1 adjacent to the interface block S3 such that the main arm A1 of the DEV layer B1 can access the shelf unit U3. The shelf unit U3 has a second transfer unit through which a wafer W is transferred to and from the interface block S3.

The exposure system S4 is disposed behind the shelf unit U3 and is connected to the rear end of the processing block S2 by the interface block S3. An interface arm F is disposed in the interface block B3. The interface arm F transfers a wafer between the second transfer unit of the shelf unit U3 of the DEV layer B1 and the exposure system S4. The interface arm F can move in longitudinal directions and vertical directions and can turn about a vertical axis.

The construction of the unit blocks B1 to B4 will be described. First, the COT layer B3 will be described with reference to FIGS. 3 to 5. A carrying region R1 extends in a longitudinal direction, namely, a direction Y in FIG. 1, in a substantially central part of the COT layer B3. A wafer W is carried in the carrying region R1. A coating unit 31 provided with a plurality of coating devices, namely, wet processing devices, for applying a resist solution to a wafer W is disposed on the right-hand side, as viewed rearward from the front end, namely, the carrier block S1, of the carrying region R1.

Figure 5:
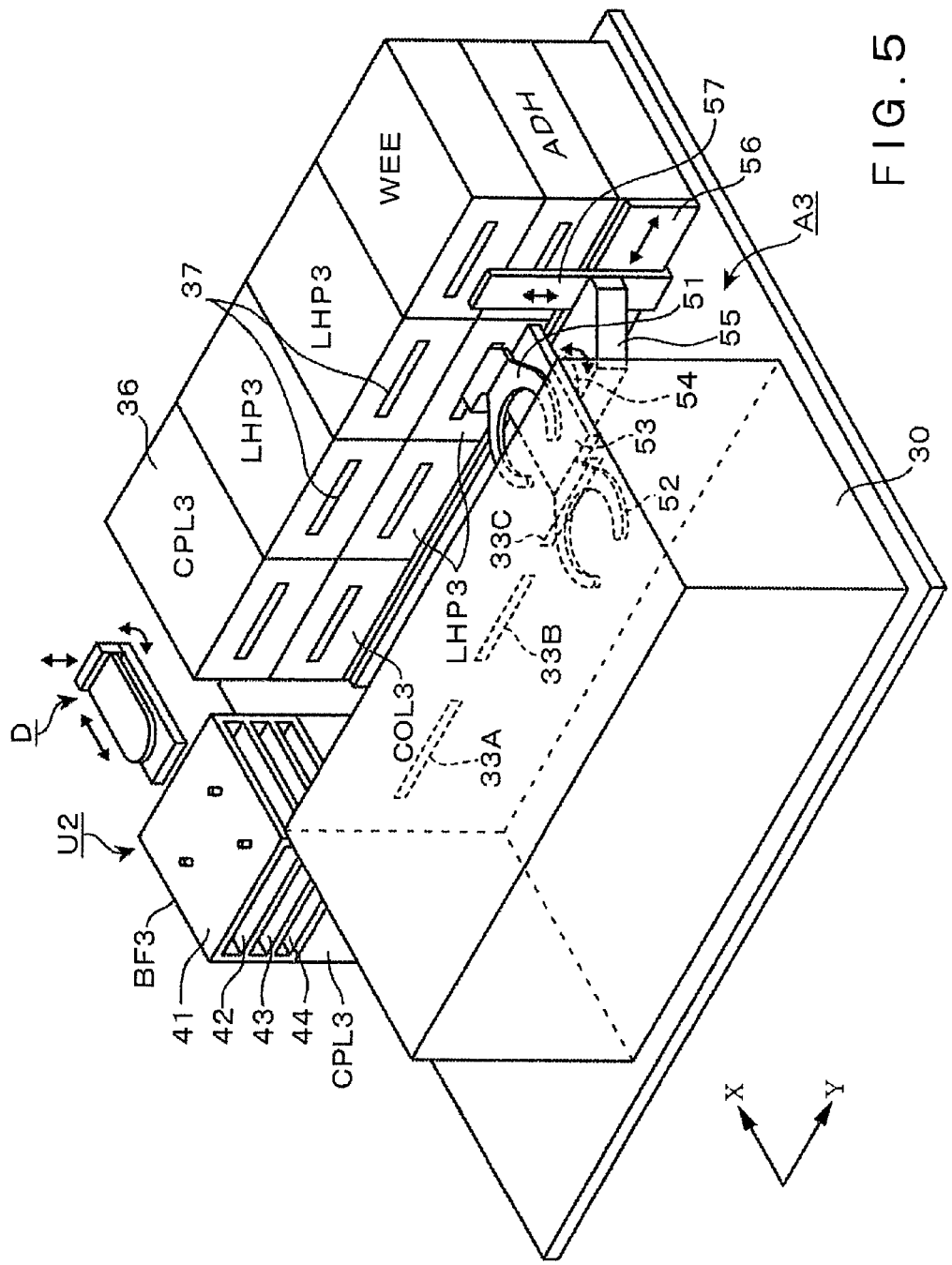
FIG. 5 is a perspective view of a coating unit, a shelf unit and a main arm A3 included in the COT layer.

In this embodiment, the plurality of wet processing devices are three coating devices 32A, 32B and 32C arranged in the direction Y in a processing vessel 30 so as to face the carrying region R1. Each of the coating devices 32A to 32C pours a resist solution, namely, a coating solution, through a common chemical solution pouring nozzle onto a wafer W attracted to and held by, for example, a spin chuck in a horizontal position and rotates the wafer W to spread the resist solution over the entire surface of the wafer W. Thus the surface of the wafer W is coated with the resist solution. Each of the processing devices 32A to 32C is provided with a cup capable of surrounding the wafer W held on the spin chuck. The processing vessel 30 is provided with openings 33A, 33B and 33C at positions respectively corresponding to the coating devices 32A to 32C as shown in FIG. 5. The main arm A3 carries a wafer W into and out of the coating devices 32A to 32C through the openings 33A to 33C respectively corresponding to the coating devices 32A to 32C.

The coating unit 31 has a shelf unit U1 disposed on the other side of the carrying region R1. The shelf unit U1 has processing units arranged, for example, in two layers and four rows. The processing units are those for processing a wafer W by a pretreatment process before the wafer W is processed by the coating unit 31 and for processing the wafer W processed by the coating unit 31 by a posttreatment process. Those processing units include heating units LHP3 for processing a wafer W coated with the resist solution by a heating process, cooling units COL3 for cooling the wafer W processed by the heating process by the heating unit LHP3 at a predetermined temperature, a temperature conditioning unit CPL3 for adjusting the temperature of a wafer W to a predetermined temperature, a hydrophobicity imparting unit ADH and an edge exposure device WEE.

Each of the heating units LHP3 is a heating and cooling device provided with a heating plate 34 for heating a wafer W mounted thereon and a cooling plate 35 serving also as a carrying arm. A wafer W is transferred between the main arm A3 and the heating plate 34 by the cooling plate 35. Each of the temperature conditioning unit CPL3 and the cooling unit COL3 is a cooling device provided with, for example, a water-cooled cooling plate. As shown in FIG. 5, the processing units including the heating units LHP3 and the temperature conditioning unit CPL3 are contained in processing vessel 36, respectively. The processing vessels 36 are provided with openings 37 facing the carrying region R1, respectively.

The shelf unit U2 of the COT layer B3 has a buffer unit BF3 capable of holding a plurality of wafers W, and a temperature conditioning unit CPL3 for adjusting the temperature of a wafer W to a predetermined temperature. The buffer unit BF3 and the temperature conditioning unit CPL3 are stacked. The main arm A3 and the transfer arm D of the COT layer B3 can access the buffer unit BF3 and the temperature conditioning unit CPL3. The buffer unit BF3 is provided with support stages 41 to 44. The number of the support stages 41 to 44 is greater than that of the coating devices 32A to 32C by one.

Thus the buffer unit BF3 can hold four wafers W. Each of the support stages 41 to 44 is provided with a plurality of projections, for example, three projections. The projections are arranged on the support stages 41 to 44 so that the projections may not interfere with the main arm A3 and the transfer arm D when the main arm A3 and the transfer arm D advance into spaces extending over the support stages 41 to 44. A wafer W is supported on the three projection of each of the stages 41 to 44.

The main arm A3 installed in the carrying region R1 will be described. The main arm A3 can carry a wafer to and from all the modules in which a wafer is placed of the COT layer B3, namely, the processing units of the shelf unit U1, the coating unit U1 and the transfer devices of the shelf unit U2. The main arm A3 can move in transverse directions, in directions parallel to a Y axis and vertical directions and can turn about a vertical axis.

Figure 4:
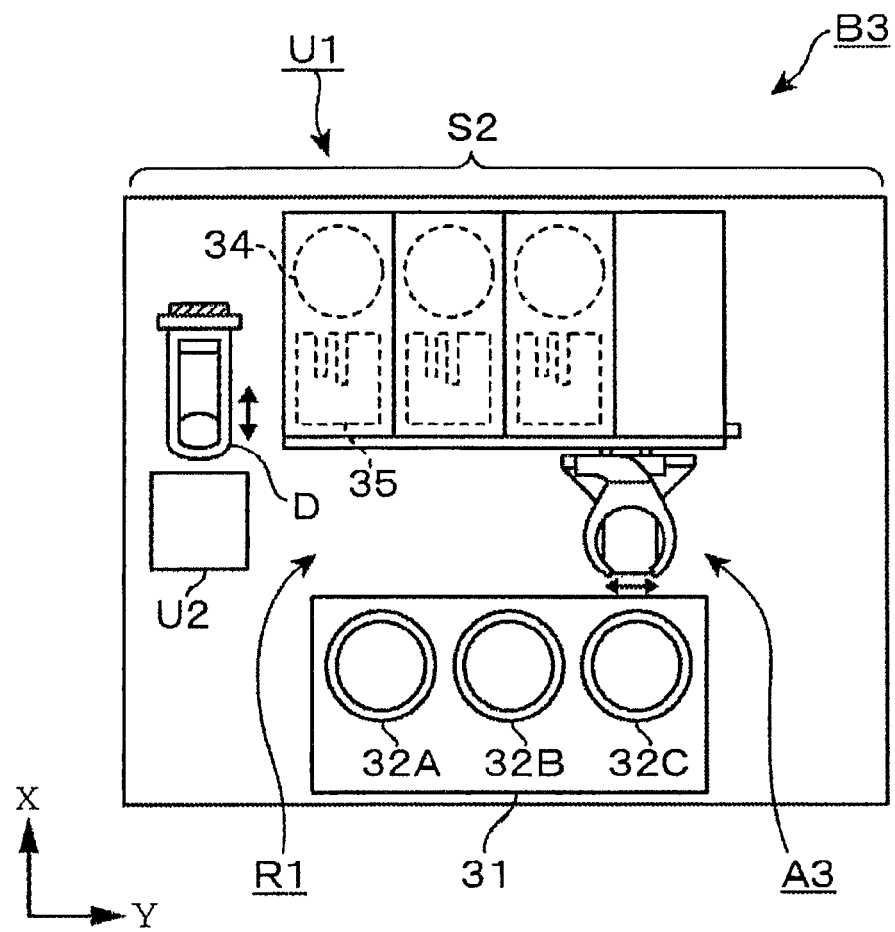
FIG. 4 is a plan view of a unit block of a COT layer B3 included in the coating and developing system shown in FIG. 1.

Referring to FIGS. 3 to 5, the main arm A3 is provided with two support arms 51 and 52 on which peripheral parts of a wafer W is seated. The support arms 51 and 52 can individually move in opposite directions on a base 53. The base 53 is mounted on a carrier body 55 so as to be turned about a vertical axis by a turning mechanism 54. In FIG. 5, indicated at 56 is a horizontal guide rail longitudinally extending in the carrying region R1 in the Y direction (FIG. 1) and at 57 is a vertical guide rail. The carrier body 55 can vertically move along the vertical guide rail 57. A lower end part of the vertical guide rail 57 underlies the horizontal guide rail 56 such that the vertical guide rail 57 can longitudinally move together with the carrier body 55 along the horizontal guide rail 56 in the carrying region R1. The vertical guide rail 57 is connected to the carrier body 55 such that the vertical guide rail 57 does not interfere with each of the support arms 51 and 52 when each of the support arms 51 and 52 is advanced and retracted to transfer a wafer W between each of the support arms 51 and 52 and each of the processing units of the shelf unit U1.

Other unit blocks will briefly be described. The coating film forming unit blocks B2 to B4 are similar in construction. The BCT layer B2 is provided with a first antireflection film forming unit BCT, namely, a wet processing unit. The first antireflection film forming unit BCT coats a surface of a wafer W with a coating solution for forming a first antireflection film. The shelf unit U1 has heating units LHP2 each provided with a heating plate on which a wafer W processed by an antireflection forming process is subjected to a heating process, a temperature conditioning unit CPL2 for adjusting the temperature of the wafer W to a predetermined temperature, and a cooling unit COL2. The shelf unit U2 has a first transfer unit including a buffer unit BF2 capable of holding a plurality of wafers W, for example, four wafers W, and a temperature conditioning unit CPL2 for adjusting the temperature of a wafer W to a predetermined temperature and for receiving a wafer W from and returning a wafer W to the carrier block S1. A main arm A2 carries a wafer W to and receives a wafer W from each of those modules.

The TCT layer B4 is provided with a second antireflection film forming unit TCT, namely, a wet processing unit. The second antireflection film forming unit TCT coats a surface of a wafer W with a coating solution for forming a second antireflection film. The shelf unit U1 has heating units LHP4 each provided with a heating plate on which a wafer W processed by an antireflection forming process is subjected to a heating process, a temperature conditioning unit CPL4 for adjusting the temperature of the wafer W to a predetermined temperature, a cooling unit COL4, and an edge exposure device WEE. The shelf unit U2 has a first transfer unit including transfer stage TRS4 and a temperature conditioning unit CPL4. A main arm A4 carries a wafer W to and receives a wafer W from each of those modules.

Figure 6:
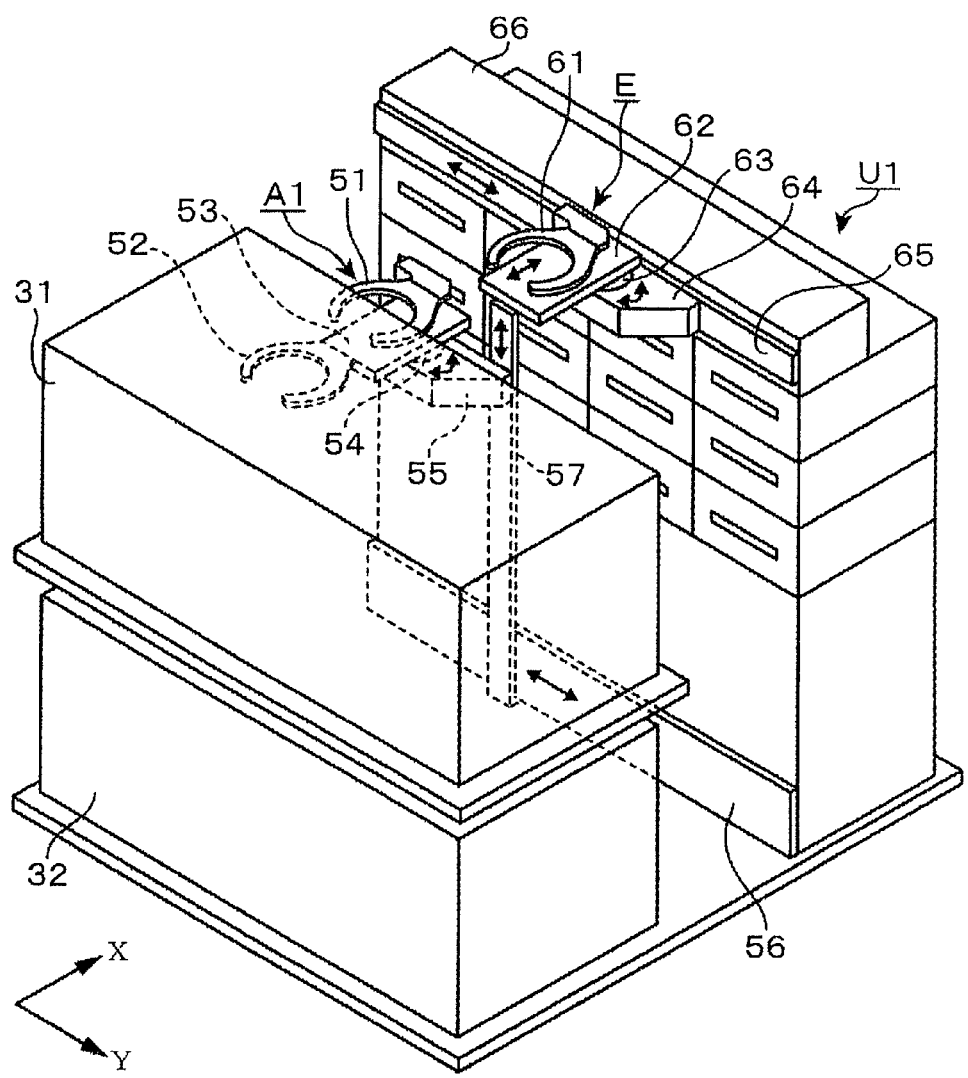
FIG. 6 is a perspective view of a developing unit, shelf unit, a main arm A1 and a shuttle arm E of a unit block included in a DEV layer B1 of the coating and developing system shown in FIG. 1.

Referring to FIGS. 1, 3 and 6, the DEV layer B1 has the shelf unit U1 including processing units arranged in three layers and four rows, the shelf unit U3 and a shuttle arm E. The DEV layer B1 is substantially similar in construction to the COT layer B3 in other respects. The DEV layer B1 is provided with developing units 32 stacked in two layers as the wet processing units. The shelf unit U1 includes a postexposure baking unit PEB1, namely, a heating unit, for processing a wafer W processed by an exposure process by a heating process, a cooling unit COL1 for cooling a wafer processed by the postexposure baking unit PEB1 at a predetermined temperature, a postbaking unit POST1, namely, a heating unit, for processing a wafer W processed by a developing process by a heating process to remove moisture from the wafer W, and a temperature conditioning unit CPL1 for adjusting the temperature of a wafer W processed by the postbaking unit POST1 to a predetermined temperature. The first and the second antireflection film forming units and the developing unit 32 are substantially similar in construction to the coating unit 31.

The shelf unit U2 is provided with a temperature conditioning unit CPL11 in an upper layer and two transfer stages TRS11 and TRS12 in lower layers. The temperature conditioning unit CPL11 serves as a first transfer unit. The shelf unit U3 is provided with a temperature conditioning unit CPL12 and two transfer stages TRS13 and TRS14 disposed under the temperature conditioning unit CPL12. The temperature conditioning unit CPL12 of the shelf unit U3 and the temperature conditioning unit CPL11 of the shelf unit U2 are opposed to each other and are disposed at the opposite ends of a carrying region R1, respectively, A wafer W is transferred from and to the carrier block S1 through the transfer stages TRS11 and TRS12 of the shelf unit U2. A wafer W is transferred to and from the interface block S3 through the transfer stages TRS13 and TRS14 of the shelf unit U3.

Referring to FIGS. 1, 3 and 6, the shuttle arm E is used specially for carrying a wafer W between the temperature conditioning unit CPL11 of the shelf unit U2 and the temperature conditioning unit CPL12 of the shelf unit U3, for example, in an upper space in the DEV layer B1. As shown in FIG. 6, the shuttle arm E includes a support arm 61 on which a peripheral part of a wafer W is seated, a base 62, a turning mechanism 63 and a carrier body 64. The support arm 61 is supported on the base 62 so as to be advanced and retracted. The turning mechanism 63 supports the base 62 on the carrier body 64 so as to be turnable about a vertical axis. A guide rail 65 is held on a surface, facing the carrying region R1, of a support member 66 extended in the longitudinal direction parallel to the length of the shelf unit, namely, the Y direction, so as to extend along the carrying region R1, for example, in an upper part of the shelf unit U1. The carrier body 64 moves longitudinally along the guide rail 65. The shuttle arm E accesses the temperature conditioning unit CPL11 of the shelf unit U2 and the temperature conditioning unit CPL12 of the shelf unit U3 to carry a wafer W between the temperature conditioning units CPL11 and CPL12.

Figure 7:
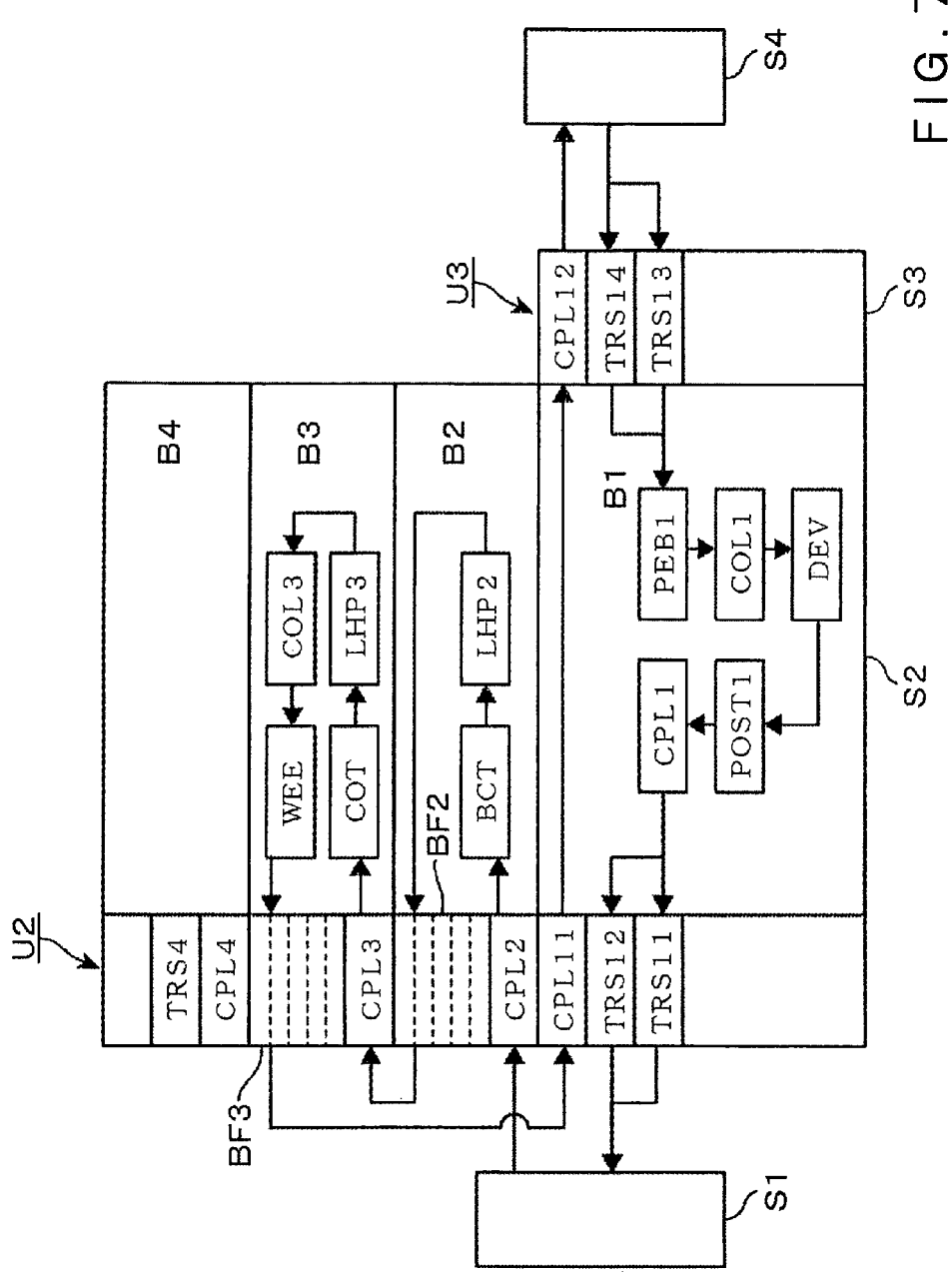
FIG. 7 is a side elevation of assistance in explaining the flow of a wafer W in the coating and developing system shown in FIG. 1.

The flow of a wafer W in the resist pattern forming system will be briefly described for a case where coating films, namely, a first antireflection film and a resist film, are formed on the wafer W with reference to FIG. 7. A carrier 20 containing wafers W is delivered to the carrier block S1. The transfer arm C takes out the wafer W from the carrier 20. Then, the wafer W is transferred through the temperature conditioning unit CPL12 of the shelf unit U2 to the BCT layer B2. The wafer W is carried along a route passing the main arm A2, the first antireflection forming unit BCT, the main arm A2, and the heating unit LHP2 in that order to form a first antireflection film on a surface of the wafer W.

Subsequently, the main arm A2 takes out the wafer W from the heating unit LHP2, and then the wafer W is carried along a route passing the support stage 41 of the buffer unit BF2 of the shelf unit U2, the transfer arm D, the temperature conditioning unit CPL3 of the shelf unit U2, the main arm A3 of the COT layer B3, the coating unit COT, the main arm A3, the heating unit LHP3, the main arm A3, the cooling unit COL3, the main arm A3 and the edge exposure device WEE in that order to form a resist film on the first antireflection film.

Then, the wafer W is carried along a route passing the support stage 41 of the buffer unit BF3 of the shelf unit U2, the transfer arm D, the temperature conditioning unit CPL11 of the shelf unit U2, the shuttle arm E, and the temperature conditioning unit CPL12 of the shelf unit U3 in that order. Subsequently, the wafer W is carried by the interface arm F of the interface block S3 to the exposure system S4 and is subjected to a predetermined exposure process.

The wafer W processed by the exposure process is carried along a route passing the interface arm F, the transfer stage TRS13 or TRS14 of the shelf unit U3 and the main arm A1 in that order to the DEV layer B1. In the DEV layer B1, the wafer W is carried along a route passing the heating unit PEB1, the cooling unit COL1, the developing unit DEV, the heating unit POST1, and the temperature conditioning unit CPL1 in that order to subject the wafer W to a predetermined developing process. The wafer W processed by the exposure process is delivered through the transfer stage TRS11 or TRS12 to the transfer arm C. The transfer arm C returns the wafer W to the carrier 20.

In this example, the temperature conditioning unit CPL2, the first antireflection forming unit BCT, the heating unit LHP2, the temperature conditioning unit CPL3, the coating unity COT, the heating unit LHP3 and the cooling unit COL3 correspond to the temperature conditioning unit to adjust the temperature of the wafer W to a first temperature, the first coating unit, the first heating unit, the temperature conditioning unit for adjusting the temperature of the wafer W to a second temperature, the second coating unit, the second heating unit, and the cooling unit, respectively.

The resist pattern forming system is provided with a controller 100. The controller 100, namely, a computer, for managing a recipes for the processing units, recipes defining the flow of the wafer W (carrying routes), and controls the processes to be carried out by the processing units, and operations of the main arms A1 to A4, the transfer arm C, the transfer arm D, the shuttle arm E and the interface arm F. The controller 100 has a program storage device storing a computer program. The program, namely, a piece of software, includes instructions specifying operations of the resist pattern forming system, i.e., steps of the processes to be carried out by the processing units and steps of carrying a wafer W to form a desired resist pattern on the wafer W. The controller 100 reads the program from the program storage device and controls the operations of the resist pattern forming system according to the program.

The program is stored in a storage medium, such as a flexible disk, a hard disk, a compact disk, a magnetooptical disk or a memory card, and the storage medium is held in the storage device.

Figure 8:
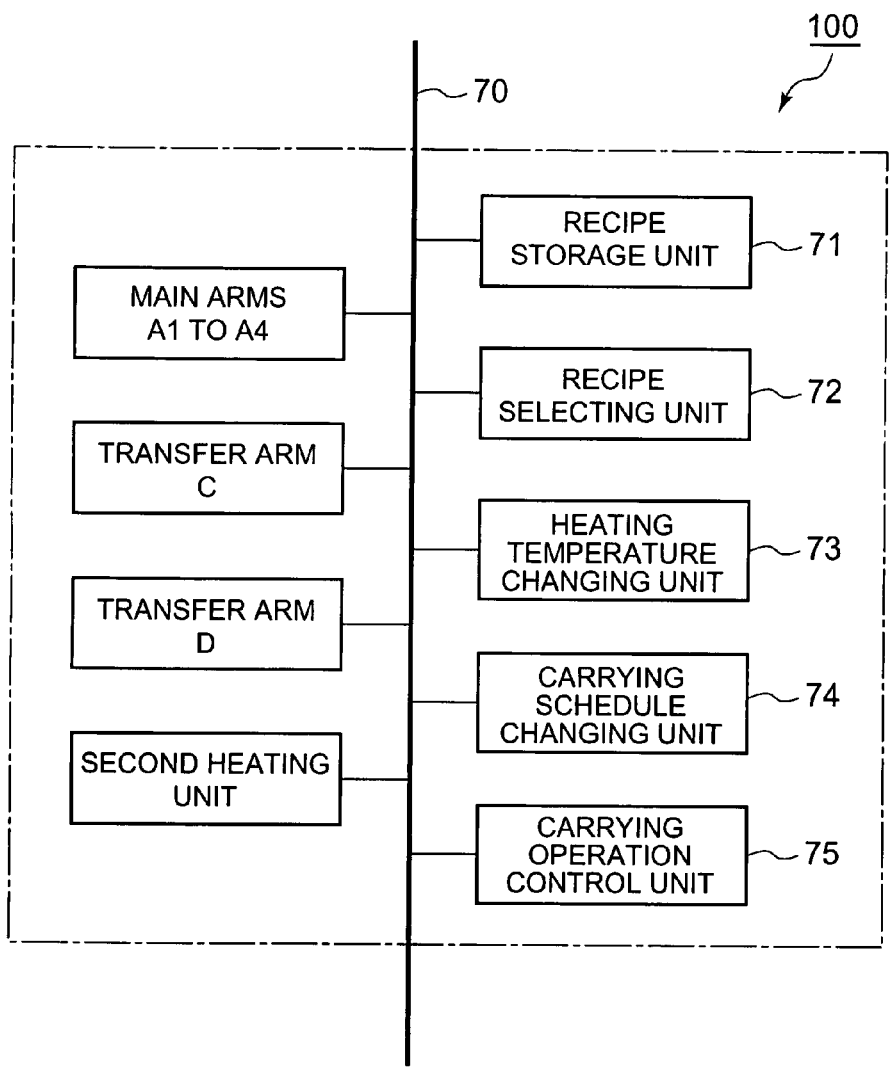
FIG. 8 is a bloc diagram of a controller included in the coating and developing system shown in FIG. 1.

FIG. 8 shows the configuration of the controller 100. Actually, the controller 100 includes a CPU (central processing unit), a program and a memory. Since the present invention is featured by the mode of carrying a wafer W in the unit blocks B2 to B4 for forming a coating film, some of the components related with the mode of carrying a wafer W will be described with reference to a block diagram shown in FIG. 8. Referring to FIG. 8, a recipe storage unit 71, a recipe selecting unit 72, a heating temperature changing unit 73, a carrying schedule changing unit 74, a carrying operation control unit 75, the main arms A1 to A4, the transfer arm C, the transfer arm D and the second heating unit are connected to a bus 70.

The recipe storage unit 71 corresponds to a storage unit. For example, a carrying recipe specifying carrying routes along which wafers W are to be carried, a carrying schedule for timing carrying operations for carrying wafers W of a lot to the units on the basis of the carrying recipe, and a plurality of recipes specifying processing conditions for processing wafers W. For example, the carrying schedule assigns numbers indicating carrying order to wafers W and is formed by arranging carrying cycle data specifying the relation between carrying cycles, the modules and the numbers assigned to the wafers W in a time series. The recipe selecting unit 72 selects appropriate one of the recipes stored in the recipe storage unit 71. The recipe selecting unit 72 can enter, for example, the number of wafers to be processed, the type of resist and a temperature for the heating process.

The heating temperature changing unit 73 changes the process temperature of the second heating unit from a temperature for processing wafers of the same type of a lot A taken out from a carrier to a temperature for processing wafers of the same type of a lot B taken out from another carrier after the completion of processing the last wafer A10 of the lot A by the heating process by the second heating unit. For example, the heating temperature gives a temperature change command requesting changing the temperature of the heating plate 34 after the completion of processing the last wafer A10 of the lot A by the heating process by the second heating unit.

The carrying schedule changing unit 74 changes a carrying schedule when the process temperature of the second heating unit is changed from a temperature for processing the wafers A of the lot A to a temperature for processing the wafers B of the lot B to process the wafers B of the lot B subsequently to the wafers A of the lot A. A carrying schedule changing procedure will be described later.

The carrying operation control unit 75 refers to the carrying schedule and controls the transfer arm C, the main arms A1 to A4 and the transfer arm D so that wafers written to carrying cycle data are carried to the relevant modules to carry out the carrying cycle. The carrying operation control unit 75 corresponds to a substrate carrying means control means.

Operations of this embodiment will de described. The operator selects a recipe prior to stating processing wafers W, namely, substrates. Description will be made on an assumption that a first antireflection film is formed on a wafer W, and then a resist film is formed on the first antireflection film. A carrying route between the BCT layer B2 and the COT layer B3 is characteristic. Therefore, the carrying route between the BCT layer B2 and the COT layer B3 will be specially described.

As shown in FIG. 7, a wafer W is carried along a route passing the carrier block S1, the first temperature conditioning unit CPL2, the first antireflection film forming unit BCT (the first coating unit), the first heating unit LHP2, the buffer unit BF2, the second temperature conditioning unit CPL3, the coating unit COT (the second coating unit), the second heating unit LHP3, the cooling unit COL3, and the edge exposure device WEE in the BCT layer B2 and the COT layer B3.

Figure 9:
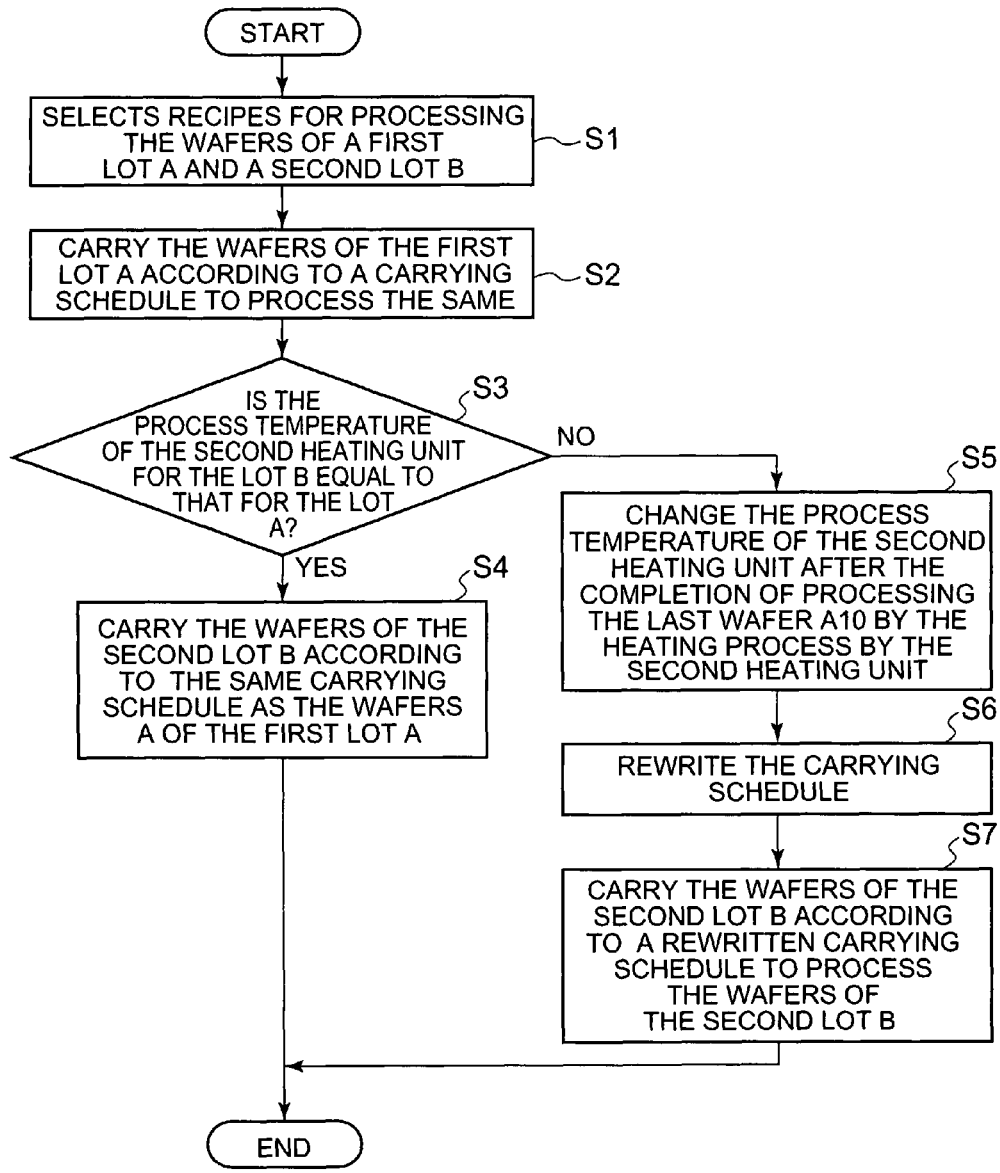
FIG. 9 is a flow chart of assistance in explaining operations of the coating and developing system shown in FIG. 1.

Referring to FIG. 9, the operator selects the recipe for successively processing the ten wafers A1 to A10 of the lot A and the ten wafers B1 to B10 of the lot B to form the first antireflection film on each of those wafers and to form the resist film on the first antireflection film in step S1. When the wafers A of the lot A and the wafers B of the lot B are processed successively, the first wafer B1 of the lot B is delivered from the carrier block S1 to the first temperature conditioning unit CPL2 subsequently to delivering the last wafer A10 of the lot A to the first temperature conditioning unit CPL2.

After the recipe has been selected, a carrying schedule for carrying the wafers A of the lot A shown in FIG. 10 is selected. In step S2, the controller 100 gives commands to the units referring to the carrying schedule to process the wafers A. According to this carrying schedule, the wafers A of the lot A are carried along the route mentioned above from the BCT layer B2 through the support stage 41 of the buffer unit BF2 to the COT layer B3 after being heated by the first heating unit LHP2. Each of the main arms A1 to A4 is provided with at least two support arms. Therefore, the main arms A2 and A3 transfer the wafers in the lower modules successively t the next modules, respectively so that the wafers of the lower numbers are in the lower modules. The succeeding carrying cycle is executed after the completion of the preceding carrying cycle. Thus the carrying cycles are executed sequentially to carry the wafers A along the predetermined route and to subject the wafers A to the predetermined processes.

In step S3, a query is made to see if the process temperature of the second heating unit LHP3 for the lot B is equal to that for the lot A. If the response to the query in step S3 is affirmative, the wafers B are carried according to the same carrying schedule as the wafers A in step S4 to process the wafers B. If the response to the query in step S3 is negative, step S5 is executed. In step S5, the heating temperature changing unit 73 changes the process temperature of the second heating unit LHP3 from a temperature for processing the wafers A to a temperature for processing the wafers B after the completion of processing the last wafer A10 of the lot A by the heating process by the second heating unit LHP3. Then, step S6 is executed. In step S6, the carrying schedule changing unit 74 rewrites the carrying schedule, which will be describeed later. The wafers B of the lot B are carried according to a rewritten carrying schedule in step S7.

A carrying schedule rewriting procedure will be described. The wafers B of the lot B are carried according to a carrying schedule shown in FIG. 10. The carrying schedule is rewritten such that the wafer B2 processed by the heating process by the first heating unit LHP2 subsequently to the first wafer B1 is delivered in due order to the support stages 41 to 44 of the buffer unit BF2 from a carrying cycle 16 succeeding the carrying cycle 15 in which the first wafer B1 of the lot B is carried to the second temperature conditioning unit CPL3, and the wafers B2 to B5 held in the buffer unit BF2 are carried in due order to the lower modules after the second heating unit LHP3 has been set for the process temperature for processing the wafers B of the lot B. When the resist pattern forming system has a plurality of second temperature conditioning units CPL3, the wafers B succeeding the wafers B distributed to the second temperature conditioning units CPL3 is the wafer processed by the first heating unit LHP2 subsequently to the first wafer B.

More concretely, the carrying schedule is rewritten such that (1) an operation for carrying out the first wafer B1 of the lot B from the second temperature conditioning unit CPL3 preceding the second coating unit COT is stopped to avoid carrying the first wafer B1 to the second coating unit COT, (2) when the resist pattern forming system has the single second temperature conditioning unit CPL3, the carrying schedule is changes such that the second wafer B2 to the fifth wafer B5 of the lot B processed by the first heating unit LHP2 are carried to the support stages 41 to 44 of the buffer unit BF2, (3) an operation for carrying out the wafer B6 from the first temperature conditioning unit CPL2 preceding the first coating unit BCT is stopped to avoid carrying the wafer B to the support stages 41 to 44 of the buffer unit BF2 while two or more wafers B are held on the support stages 41 to 44 of the buffer unit BF2, (4) the first wafer B1 of the lot B is carried out from the second temperature conditioning unit CPL3 preceding the second coating unit COT after the process temperature of the second heating unit LHP3 has been changed to start carrying the wafers to the second coating unit COT, (5) an operation for carrying out the wafer B6 is resumed upon the start of sending out the wafers B2 to B5 from the buffer unit BF2, and (6) the wafer B6 lastly carried to the first temperature conditioning unit CPL2 in (3) and the following wafers B7 to B10 are carried according to the same carrying schedule as the wafers A along a route passing the first heating unit LHP2, the support stage 41 of the buffer unit BF2, and the second temperature conditioning unit CPL3 in that order.

Thus the resist pattern forming system processes the wafers A1 to A2 of the lot A and the wafers B1 to B10 of the lot B successively in the processing block S2 and, when the process temperature of the second heating unit LHP3 for processing the wafers A1 to A10 of the lot A and that of the second heating unit LHP3 for processing the wafers B1 to B10 of the lot B are different, rewrite the carrying schedule to carry the wafers from the first heating unit LHP2 to the buffer unit BF2, and starts carrying the wafers to the second coating unit (the coating unit COT) immediately after the process temperature of the second heating unit LHP3 has been changed. Therefore, as compared with the conventional carrying schedule that starts sending out the wafers B of the lot B from the carrier block S1 after the process temperature of the second heating unit LHP3 has been changed, the carrying schedule of the present invention can reduce processing time and improve the throughput of the resist pattern forming system.

Figure 15:
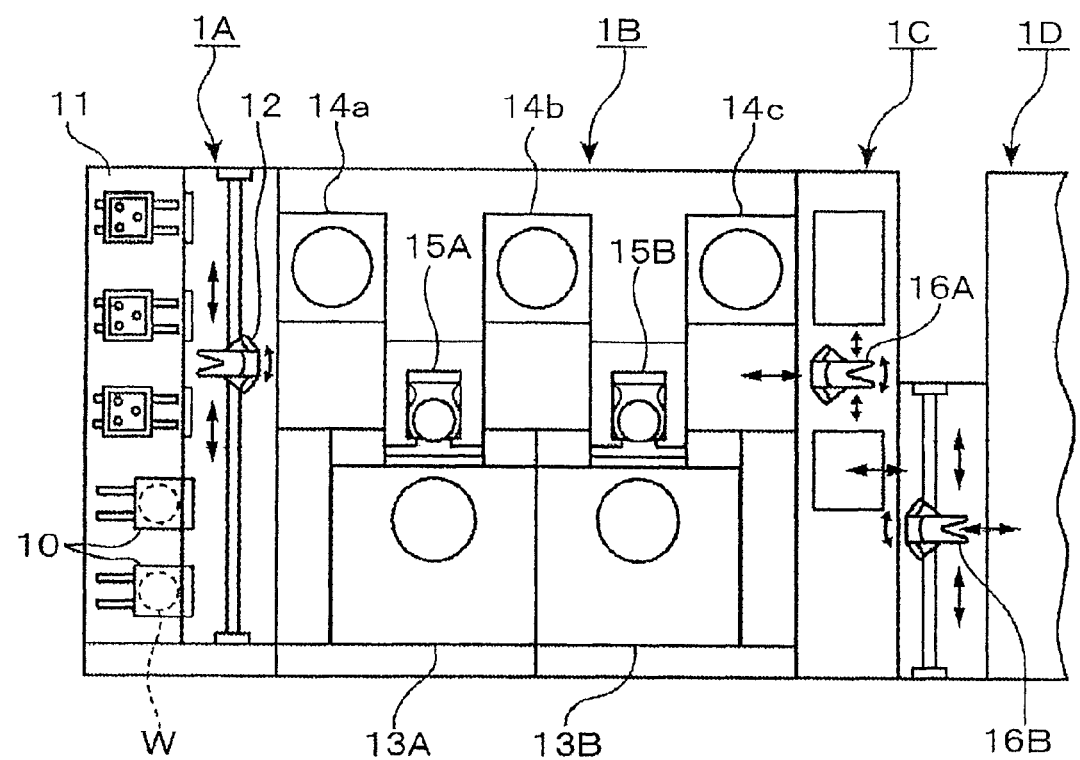
FIG. 15 is a plan view of a conventional coating and developing system.

FIG. 11 shows a conventional carrying schedule for carrying wafers to process the wafers by a coating and developing system shown in FIG. 15. As shown in FIG. 11, operations for sending out the wafers B1 to B10 of the lot B from the carrier block S1 to the first temperature conditioning unit CPL2 are started from a carrying cycle 28 after the process temperature of the second heating unit LHP3 has been changed. Therefore, a time for which the wafers B of the lot B are not carried to the second heating unit LHP3 after the process temperature of the second heating unit LHP3 has been changed is added to a time for changing the process temperature of the second heating unit LHP3. Consequently, carrying the first wafers B1 of the lot B to the second heating unit LHP3 after the process temperature of the second heating unit LHP3 has been changed is withheld for a time corresponding to five carrying cycles. Thus forty-four carrying cycles need to be carried out to carry the wafers A1 to A10 and the wafers B1 to B10 to the edge exposure device WEE.

According to the present invention, as obvious from FIG. 10, carrying the first wafer B1 of the lot B to the second heating unit LHP3 is withheld for a time corresponding to one carrying cycle after the process temperature of the second heating unit LHP3 has been changed. According to the present invention, operations for processing the wafers B of the lot B by process by the second temperature conditioning unit CPL3 and those preceding the process by the second temperature conditioning unit CPL3 can be accomplished while the process temperature of the second heating unit LHP3 is being changed. Consequently, time for which processing the wafers B of the lot B is withheld uselessly can be reduced and the wafers A1 to A10 of the lot A and the wafers B1 to B10 of the lot B can be carried to the edge exposure device WEE by forty-one carrying cycles. Thus processing time needed by the resist pattern forming system of the present invention for delivering all the wafers processed by the processes preceding the process to be carried out by the edge exposure device WEE to the edge exposure device WEE is shorter by a time corresponding to three carrying cycles than that needed for the same purpose by the conventional coating and developing system and hence the throughput of the resist pattern forming system of the present invention can be increased accordingly.

The present invention holds the wafers B processed by the heating process by the first heating unit LHP2 in the buffer unit BF2. The temperature of the wafers B drops while the wafers B are held in the buffer unit BF2, which shortens time necessary for conditioning the temperature of the wafers B by the temperature conditioning unit CPL3. Holding the wafers B processed by the temperature conditioning process by the second temperature conditioning unit CPL3 in the buffer unit BF2 is not wise because the adjusted temperature of the wafers B is likely to change while the wafers B are held in the buffer unit BF2.

Figure 12:
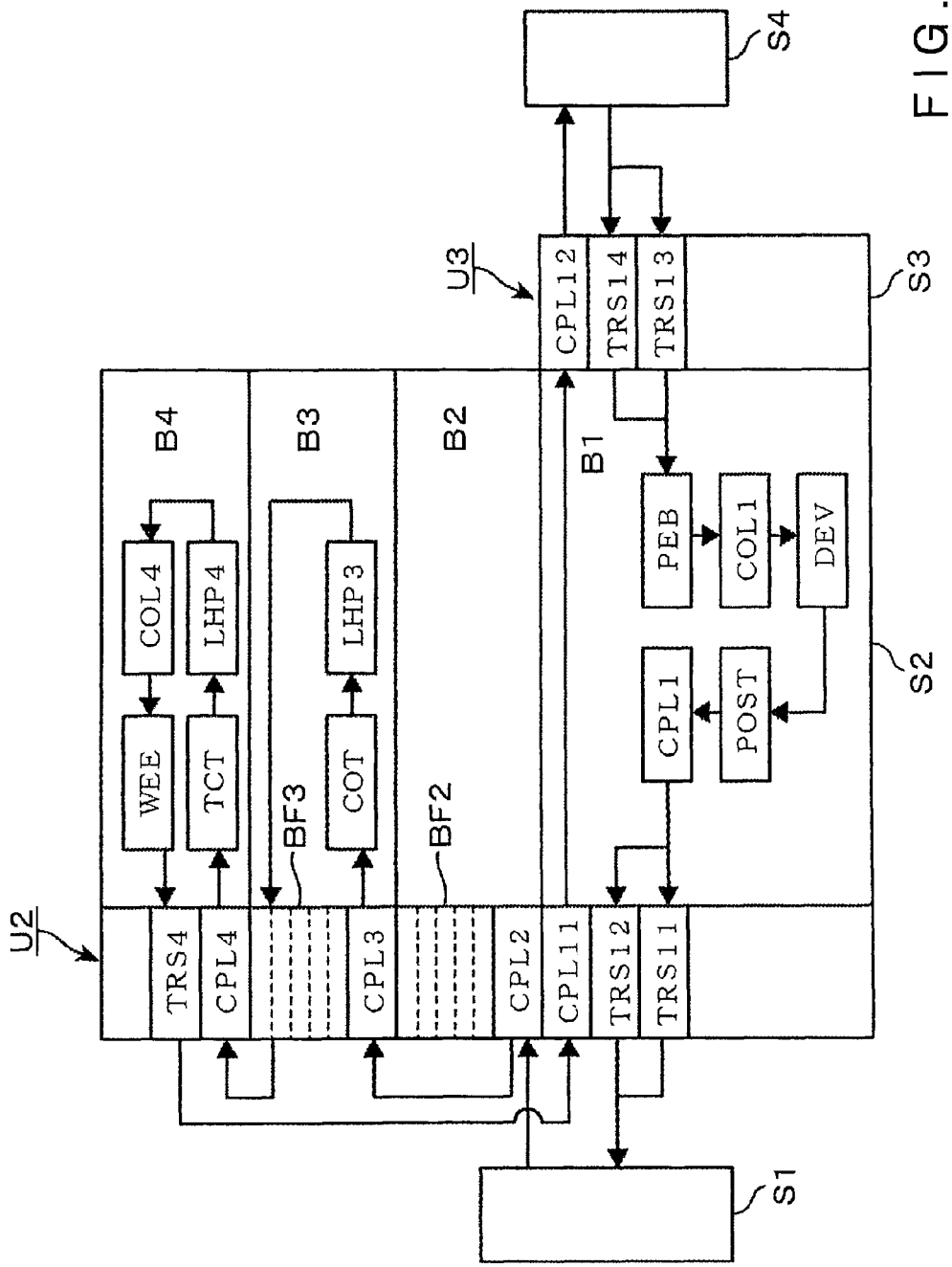
FIG. 12 is a side elevation of the coating and developing system shown in FIG. 1.

The resist pattern forming system of the present invention is applicable to a case where a surface of a wafer W is coated with a resist solution by the first coating unit and the wafer W is subjected to a coating process for coating the surface of the wafer W with a solution for forming a second antireflection film by the second coating unit. The flow of a wafer W in such a case will be briefly described with reference to FIG. 12. A wafer W taken out from the carrier block S1 by the transfer arm C is carried along a route passing the temperature conditioning unit CPL2 of the shelf unit U2, the transfer arm D, the first temperature conditioning unit CPL3, the COT layer B3, the main arm A3, the first coating unit COT, the main arm A3, and the first heating unit LHP3 in that order to form a resist film on the wafer W.

Subsequently, the wafer W is carried along a route passing the main arm A3, the support stage 41 of the buffer unit BF3 of the shelf unit U2, the transfer arm D, the second temperature conditioning unit CPL4 of the shelf unit U2, the main arm A4 of the TCT layer B4, the second antireflection film forming unit TCT (the second coating unit), the main arm A4, the second heating unit LHP4, the main arm A4, the cooling unit COL4, the main arm A4, and the edge exposure device WEE in that order to form a second antireflection film on the resist film. Then, the wafer W is carried through the transfer stage TRS4 of the shelf unit U2 to the temperature conditioning unit LHP3 of the shelf unit U2 by the transfer arm D. Then, the wafer W is carried along the foregoing route passing the exposure system S4, and the DEV layer B1 to the carrier block S1.

When ten wafers A1 to A10 of a preceding lot A and ten wafers B1 to B10 of a succeeding lot B are to be processed continuously and the process temperature of the second heating unit LHP4 needs to be changed from a temperature for processing the wafers of the lot A to a temperature for processing the wafers of the lot B, the heating temperature changing unit 73 changes the process temperature of the second heating unit LHP4 from the temperature for processing the wafers of the lot A to the temperature for processing the wafers of the lot B after the last wafer A10 of the lot A has been processed by the heating process by the second heating unit LHP4. The carrying schedule changing unit 74 rewrites the carrying schedule such that the wafer B2 processed by the heating process by the first heating unit LHP2 subsequently to the first wafer B1 is delivered in due order to the buffer unit BF3 from a carrying cycle succeeding a carrying cycle in which the first wafer B1 of the lot B is carried to the second temperature conditioning unit CPL4, and the wafers B held in the buffer unit BF3 are carried in due order to the lower modules after the second heating unit LHP4 has been set for the process temperature for processing the wafers B of the lot B. Then, the main arms A3 and A4 carry the wafers according to the rewritten carrying schedule.

More concretely, the carrying schedule is rewritten such that (1) an operation for carrying out the first wafer B1 of the lot B from the second temperature conditioning unit CPL4 preceding the second coating unit TCT is stopped to avoid carrying the first wafer B1 to the second coating unit TCT, (2) the carrying schedule is changes such that the second wafer B2 to the fifth wafer B5 of the lot B processed by the first heating unit LHP3 are carried to the support stages 41 to 44 of the buffer unit BF3, (3) an operation for carrying out the wafer B6 from the first temperature conditioning unit CPL3 preceding the first coating unit COT is stopped to avoid carrying the wafer B to the first coating unit COT while two or more wafers B are held on the support stages 41 to 44 of the buffer unit BF2, (4) the first wafer B1 of the lot B is carried out from the second temperature conditioning unit CPL4 preceding the second coating unit TCT after the process temperature of the second heating unit LHP4 has been changed to start carrying the wafers to the second coating unit TCT, (5) an operation for carrying out the wafer B6 is resumed upon the start of sending out the wafers B2 to B5 from the buffer unit BF3, and (6) the wafer B6 lastly carried to the first temperature conditioning unit CPL3 in (3) and the following wafers B7 to B10 are carried according to the same carrying schedule as the wafers A along a route passing the first heating unit LHP3, the support stage 41 of the buffer unit BF3, and the second temperature conditioning unit CPL4 in that order.

The resist pattern forming system is applicable to cleaning a cup included in the second coating unit. Such a case will be described on an assumption that the first antireflection film forming unit BCT is the first coating unit, and the coating unit COT is the second coating unit, and wafers W are carried along a route shown in FIG. 7 by way of example. When the ten wafers A1 to A10 of the lot A and the ten wafers B1 to B10 of the lot B are to be processed continuously, and a cup included in the second coating unit COT is to be cleaned after all the wafers A1 to A10 of the lot A have been processed by the second coating unit COT, a cleaning operation for cleaning the cup of the second coating unit COT is started after the last wafer A10 of the lot A has been processed by a coating process by the second coating unit COT.

The wafers are carried according to a carrying schedule shown in FIG. 13 as follows.

(1) An operation for carrying the first wafer B1 of the lot B from the second temperature conditioning unit CPL3 preceding the second coating unit COT is stopped to avoid carrying the wafer B1 to the second carrying unit COT.

(2) The carrying schedule is changes such that the second wafer B2 to the fifth wafer B5 of the lot B processed by the first heating unit LHP2 are carried to the support stages 41 to 44 of the buffer unit BF3.

(3) An operation for carrying out the wafer B6 from the first temperature conditioning unit CPL2 preceding the first coating unit BCT is stopped to avoid carrying the wafer B to the first coating unit BCT while two or more wafers B are held on the support stages 41 to 44 of the buffer unit BF2.

(4) The first wafer B1 of the lot B is carried out from the second temperature conditioning unit CPL3 preceding the second coating unit COT after the cup of the second coating unit COT has been cleaned to start carrying the wafers to the second coating unit COT, (5) An operation for carrying out the wafer B6 is resumed upon the start of sending out the wafers B2 to B5 from the buffer unit BF2.

(6) The wafer B6 lastly carried to the first temperature conditioning unit CPL2 in (3) and the following wafers B7 to B10 are carried according to the same carrying schedule as the wafers A along a route passing the first heating unit LHP2, the support stage 41 of the buffer unit BF2, and the second temperature conditioning unit CPL3 in that order.

Thus the resist pattern forming system carries out a cleaning process. The carrying schedule is rewritten such that the wafers B processed by the heating process by the first heating unit LHP2 subsequently to the first wafer B1 is delivered in due order to the buffer unit BF2 from a carrying cycle succeeding a carrying cycle in which the first wafer B1 of the lot B is carried to the second temperature conditioning unit CPL3, and the first wafer B1 of the lot B is carried to the second coating unit COT immediately after the cleaning process for cleaning the second coating unit COT has been accomplished. The rewritten carrying schedule, as compared with a conventional carrying schedule (FIG. 14) that starts an operation for taking out the wafers B of the lot B from the carrier block S1 after the cleaning process for cleaning the second coating unit COT has been accomplished, can reduce processing time and can increase throughput.

The present invention is applicable also to a system having a processing block provided with a first temperature conditioning unit, a first coating unit, a first heating unit, a second temperature conditioning unit, a second coating unit, a second heating unit, a cooling unit, and a buffer unit. The numbers, the types and the arrangement of those units, namely, modules, are not limited those mentioned above, provided that wafers can be carried along a route passing the first temperature control unit, the first coating unit, the first heating unit, the buffer unit, the second temperature conditioning unit, the second coating unit, the second heating unit, and the cooling unit in that order.

In the foregoing embodiment, a wafer W is transferred between the BCT layer B2 and the COT layer B3 or between the COT layer B3 and the TCT layer B4 through one of the support stages of the buffer unit BF2 or BF3. The resist pattern forming system may be provided with a transfer stage through which a wafer W is transferred between the BCT layer B2 and the COT layer B3 or between the COT layer B3 and the TCT layer B4, in addition to the buffer units BF2 and BF3.

The number of the layers and stacking order of the stacked unit blocks are not limited to those mentioned above. Two developing unit blocks may be stacked in two layers, the coating film forming unit blocks may be stacked upward in order of the TCT layer, the COT layer, and the BCT layer. The coating film forming units may be placed in lower layers, and the developing unit block may be placed on top of the stack of the coating film forming unit blocks. The present invention is applicable not only to coating and developing systems for processing semiconductor wafers, but also to coating and developing systems for processing substrates, such as glass substrates for liquid crystal displays, namely, LCD substrates.

What is claimed is:

1. A coating and developing system comprising: a carrier block, for holding carriers each containing a plurality of substrates, provided with a transfer means for carrying the substrate from and to each of the carriers; and a processing block for forming a film on the substrate transferred thereto by the transfer means and processing the substrate processed by an exposure process by a developing process;

the processing block being provided with a substrate carrying means for carrying the substrate along a route passing a first temperature conditioning unit for adjusting temperature of the substrate to a first temperature, a first coating unit for applying a first coating solution to the substrate, a first heating unit for processing the substrate by a heating process, a second temperature conditioning unit for adjusting the temperature of the substrate to a second temperature, a second heating unit for processing the substrate by a heating process, and a cooling unit for cooling the substrate in that order, and the substrates being carried successively to modules for holding the substrate according to a carrying schedule by repeating a carrying cycle in which the substrate carrying means carries the substrate to the modules in order of increasing number of the modules such that the substrates of lower numbers are in the modules of higher numbers than the substrates of higher numbers; the improvement comprising:

a temperature changing means for changing process temperature of the second heating unit from a temperature for processing a plurality of substrates of the same type of a first lot to a temperature for processing a plurality of substrates of the same type of a second lot after the completion of processing the substrates of the first lot by a heating process by the second heating unit;

a buffer unit placed in the processing block and capable of holding at least one substrate succeeding a first substrate of a second lot belonging to the second lot and making the at least one substrate waiting for being heated by the at least one by the second heating unit, the buffer unit being positioned in the processing block as that the at least one substrate is carried from the first heating unit to the buffer unit and from the buffer unit to the second temperature conditioning unit; and a control means configured to control the substrate carrying means such that carrying cycles succeeding a carrying cycle in which the first substrate of the second lot is carried to the second temperature conditioning unit are executed to carry the substrates succeeding the first substrate and processed by a heating process by the first heating unit in due order to the buffer unit, and the substrates held in the buffer unit are carried in due order to the downstream modules after the process temperature of the second heating unit has been changed from the temperature for processing the substrates of the first lot to the temperature for processing the substrates of the second lot.

2. The coating and developing system according to claim 1, wherein the processing block includes:

a first coating film forming unit block including the first temperature conditioning unit, the first coating unit, the first heating unit, the buffer unit and the substrate carrying means for carrying the substrate to those units;

a second coating film forming unit block including the second temperature conditioning unit, a second coating unit, the second heating unit and the substrate carrying means for carrying the substrate to those units, and disposed on or beneath the first coating film forming unit block;

a developing unit block including a developing unit for processing the substrate by the developing process, the heating unit for processing the substrate by a heating process, a cooling unit for cooling the substrate, and substrate carrying means for carrying the substrate to those units, and disposed on or beneath the first and the second coating film forming unit block;

transfer parts respectively included in the first coating film forming unit block, the second coating film forming unit block and the developing unit block to transfer the substrate between the unit blocks; and transfer means for transferring the substrate among the transfer parts of the unit blocks.

3. The coating and developing system according to claim 2, wherein the substrate is carried to and carried out from the buffer unit by means of the substrate carrying means of the first coating film forming unit block and the transfer means of the processing block.

4. The coating and developing system according to claim 2 further comprising a control means for controlling the substrate carrying means so as to prevent carrying out the substrate from the first temperature conditioning unit when the two or more substrates of the second lot are held in the buffer unit.

5. The coating and developing system according to claim 2 further comprising a control means for controlling the substrate carrying means so as to start carrying out the substrate from the first temperature conditioning unit after the start of carrying the substrates of the second lot held in the buffer unit to the modules on the downstream side of the buffer unit.

6. The coating and developing system according to claim 2, wherein the first coating unit applies a coating solution for forming an antireflection film to the substrate before a resist solution is applied to the substrate, and the second coating unit applies a resist solution to the substrate.

7. The coating and developing system according to claim 2, wherein the first coating unit applies a resist solution to the substrate, and the second coating unit applies a coating solution for forming an antireflection film to the substrate after the substrate has been coated with the resist solution.

8. The coating and developing system according to claim 1, wherein the substrate is carried to and carried out from the buffer unit by means of the substrate carrying means of the first coating film forming unit block and a transfer means of the processing block.

9. The coating and developing system according to claim 1 further comprising a control means for controlling the substrate carrying means so as to prevent carrying out the substrate from the first temperature conditioning unit when the two or more substrates of the second lot are held in the buffer unit.

10. The coating and developing system according to claim 1 further comprising a control means for controlling the substrate carrying means so as to start carrying out the substrate from the first temperature conditioning unit after the start of carrying the substrates of the second lot held in the buffer unit to the modules on the downstream side of the buffer unit.

11. The coating and developing system according to claim 1, wherein the first coating unit applies a coating solution for forming an antireflection film to the substrate before a resist solution is applied to the substrate, and the second coating unit applies a resist solution to the substrate.

12. The coating and developing system according to claim 1, wherein the first coating unit applies a resist solution to the substrate, and the second coating unit applies a coating solution for forming an antireflection film to the substrate after the substrate has been coated with the resist solution.

* * * * *